United States Patent
Yan et al.

(10) Patent No.: US 8,514,008 B2
(45) Date of Patent: Aug. 20, 2013

(54) RF ISOLATION SWITCH CIRCUIT

(75) Inventors: Hongyan Yan, San Diego, CA (US); Janakiram Ganesh Sankaranarayanan, San Diego, CA (US); Bhushan Shanti Asuri, San Diego, CA (US); Himanshu Khatri, San Diego, CA (US); Vinod V. Panikkath, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 274 days.

(21) Appl. No.: 12/883,940

(22) Filed: Sep. 16, 2010

(65) Prior Publication Data

US 2012/0025927 A1 Feb. 2, 2012

Related U.S. Application Data

(60) Provisional application No. 61/368,579, filed on Jul. 28, 2010.

(51) Int. Cl.
*H03K 17/687* (2006.01)

(52) U.S. Cl.
USPC .......................................... 327/427; 327/387

(58) Field of Classification Search
None
See application file for complete search history.

(56) References Cited

U.S. PATENT DOCUMENTS

| 5,548,240 | A | 8/1996 | Bayer |
| 5,550,497 | A | 8/1996 | Carobolante |
| 6,094,088 | A | 7/2000 | Yano |
| 6,396,325 | B2 * | 5/2002 | Goodell ..................... 327/308 |
| 6,965,253 | B1 | 11/2005 | Chen et al. |
| 7,095,266 | B2 * | 8/2006 | Miske ........................ 327/427 |
| 7,157,957 | B2 * | 1/2007 | Kim ........................... 327/390 |
| 7,268,613 | B2 * | 9/2007 | Cranford et al. ........... 327/537 |
| 7,692,473 | B2 * | 4/2010 | Ono ............................ 327/427 |
| 7,928,794 | B2 * | 4/2011 | Balboni ...................... 327/427 |
| 8,004,340 | B2 * | 8/2011 | Guo et al. ................... 327/333 |
| 2005/0024122 | A1 * | 2/2005 | Evers et al. ................ 327/427 |

(Continued)

FOREIGN PATENT DOCUMENTS

| EP | 2073386 A1 | 6/2009 |
| WO | WO2007032611 | 3/2007 |

OTHER PUBLICATIONS

International Search Report and Written Opinion—PCT/US2011/045427—ISA/EPO—Jan. 18, 2012.

(Continued)

*Primary Examiner* — Cassandra Cox
(74) *Attorney, Agent, or Firm* — Ramin Mobarhan

(57) ABSTRACT

In a first aspect, an RF switch includes a main transistor and a gate-to-source shorting circuit. When the RF switch is turned off, the gate-to-source shorting circuit is turned on to short the source and gate of the main transistor together, thereby preventing a Vgs from developing that would cause the main transistor to leak. When the RF switch is turned on, the gate-to-source shorting circuit is turned off to decouple the source from the gate. The gate is supplied with a digital logic high voltage to turn on the main transistor. In a second aspect, an RF switch includes a main transistor that has a bulk terminal. When the RF switch is turned off, the bulk is connected to ground through a high resistance. When the RF switch is turned on, the source and bulk are shorted together thereby reducing the threshold voltage of the main transistor.

37 Claims, 12 Drawing Sheets

(56) References Cited

U.S. PATENT DOCUMENTS

2006/0038604 A1  2/2006  Miske
2009/0251221 A1* 10/2009 Gorbachov ................. 330/301
2009/0284339 A1 11/2009 Choi et al.
2010/0109798 A1  5/2010  Chu

OTHER PUBLICATIONS

Partial International Search Report—PCT/US2011/045427—ISA/EPO—Nov. 11, 2011.

* cited by examiner

RF ISOLATION SWITCH CIRCUIT BETWEEN THE LOW BAND SECONDARY
WINDING OF THE BALUN AND THE LOW BAND DRIVER AMPLIFIER

SINGLE-TRANSISTOR IMPLEMENTATION
OF THE RF ISOLATION SWITCH CIRCUIT

RF ISOLATION SWITCH CIRCUIT

SWITCH INPUT IMPEDANCE AT 2 GHZ VERSUS
PEAK-TO-PEAK VOLTAGE SWING

|        | CORNER | ACLR @ 7 dBM | P1dB  |
|--------|--------|--------------|-------|
| FIG. 7 | TT70   | 45.45        | 12.72 |
|        | FF110  | 42.82        | 11.89 |
| FIG. 6 | TT70   | 46.79        | 12.07 |
|        | FF110  | 34.28        | 9.01  |

ACLR AND P1dB IN AWS BAND

T-CONFIGURATION IS SOMETIMES USED

RF ISOLATION SWITCH CIRCUIT

CROSS-REFERENCE TO RELATED APPLICATION

This application claims the benefit under 35 U.S.C. §119 of Provisional Application Ser. No. 61/368,579, filed Jul. 28, 2010, entitled "RF Isolation Switch Circuit", by Yan et al., said provisional application being incorporated herein by reference.

BACKGROUND

1. Technical Field

The present disclosure relates to RF isolation switch circuits.

2. Background Information

There are many places in high frequency Radio Frequency (RF) circuits where a source of an RF signal is to be selectably either coupled to a load or is to be isolated from the load. The term "RF switch" is sometimes used to refer to a circuit that can be controlled either to couple the RF source to the load or to disconnect and isolate the RF source from the load. One location where such an RF switch is used is in a radio transmitter in the signal path of an RF signal between the transmitter balun and the transmitter driver amplifier. An RF transmit signal as supplied by the balun is either to be coupled to an input lead of the driver amplifier or is to be is to be blocked from reaching the input lead of the driver amplifier. Conventionally the RF switch is realized as a single N-channel field effect transistor. This transistor is typically made small enough that it does not load the balun output with excessive parasitic capacitance when the transistor is controlled to be off. The transistor is, however, typically made large enough to have an adequately low source-to-drain on resistance when it is controlled to be on. If the RF signal voltage swing as output by the balun is high, then a thick gate dielectric N-channel transistor is used. Alternatively, a T-switch configuration of three N-channel transistors may be used. Although these conventional RF switch circuits operate satisfactorily well in many instances, the RF switches do introduce unwanted parasitic capacitances and do degrade circuit linearity. Improvements in the operation of RF switches and in the operation of the overall transmitter circuit are sought.

SUMMARY

In a first aspect, an RF isolation switch circuit includes a first control input conductor, a second control input conductor, an RF signal input lead, an RF signal output lead, a main transistor, a gate-to-source shorting circuit, and a pair of resistors. A digital logic signal of a first digital logic polarity is present on the first control input conductor and a digital logic signal of an opposite second polarity is present on the second control input conductor. If a digital logic high voltage is present on the first control input conductor, then a digital logic low voltage is present on the second control input conductor, and vice versa.

In a first mode of operation, the RF isolation switch circuit is to be off and is to prevent an RF input signal present on the RF input lead of the RF isolation switch circuit from reaching the RF signal output lead of the RF isolation switch circuit. The digital logic signal on the first control input conductor has a digital logic low value and the digital logic signal on the second control input conductor has a digital logic high value. The main transistor is turned off by shorting its gate to its source via the gate-to-source shorting circuit and by supplying the digital logic low voltage (for example, zero volts) from the first control input conductor onto the gate of the main transistor via a resistor. The gate-to-source shorting circuit shorts the gate of the main transistor to the source of the main transistor so the gate-to-source voltage (Vgs) on the main transistor remains close to zero volts even in conditions of a large peak-to-peak AC voltage amplitude of the RF input signal on the source of the main transistor.

In the second mode of operation, the RF isolation switch circuit is to be on and is to couple the RF signal on the RF signal input lead through the RF isolation switch circuit to the RF signal output lead of the RF isolation switch circuit. The digital logic signal on the first control input conductor has a digital logic high value and the digital logic signal on the second control input conductor has a digital logic low value. The gate-to-source shorting circuit is turned off so that the gate of the main transistor is not coupled to the source of the main transistor. The digital logic high voltage (for example, 1.3 volts) present on the first control input conductor is resistively coupled onto the gate of the main transistor, thereby turning the main transistor on. The digital logic low voltage (for example, zero volts) present on the second control input conductor is coupled to gates of turn-off transistors in the gate-to-source shorting circuit, thereby turning those transistors off and turning the gate-to-source shorting circuit off.

In one example, the gate-to-source shorting circuit includes a first turn-off transistor having a second terminal coupled to the gate of the main transistor and having a first terminal coupled to an intermediate mode. The gate-to-source shorting circuit further includes a second turn-off transistor having a second terminal coupled to the intermediate node and having a first terminal coupled to the source of the main transistor. The gate terminals of the first and second turn-off transistors are coupled together to receive the control input signal on the second control input conductor. The intermediate node is resistively coupled to the first control input conductor so when the main transistor is being turned off a digital logic low voltage (for example, zero volts) on the first control conductor is resistively coupled onto the intermediate node.

In addition, a resistor resistively couples the drain of the main transistor to the second control input conductor so that when the RF isolation switch circuit is to be turned off, the drain of the main transistor is resistively pulled up to the digital logic high voltage (for example, 1.3 volts) present on the second control input conductor. This helps assure that the gate voltage of the main transistor does not rise above the drain voltage and helps prevent the main transistor from leaking.

The RF isolation switch circuit sees use in many applications including between a balun of an RF transmitter and a driver amplifier. The RF isolation switch also sees use between an output of a driver amplifier and a load that is to be selectively driven by the driver amplifier. The RF isolation switch circuit is usable to realize an RF switch/attenuator. An RF isolation switch circuit in such an application in one example is disposed in an RF transceiver integrated circuit and is controlled by a processor executing a set of processor-executable instructions located in a digital baseband integrated circuit. As a result of the executing of the instructions, the processor controls the RF isolation switch circuit by sending appropriate digital control information in serial form across a serial bus from the digital baseband integrated circuit to the RF transceiver integrated circuit such that the control information is then used to control the RF isolation switch circuit to be on or to be off.

In a second aspect, an RF isolation switch circuit includes a main transistor having a separately controllable bulk electrode or terminal. In a first mode of operation, the RF isolation switch circuit is to be turned on. A first switch transistor disposed between the bulk terminal and the source terminal of the main transistor is turned on to short the bulk of the main transistor to the source of the main transistor. A second switch transistor usable to couple the bulk through a resistor to a ground conductor is turned off. Shorting the bulk to the source when the RF switch is on reduces the threshold voltage of the main transistor, thereby helping keep the main transistor turned on and helping reduce the source-to-drain on resistance through the main transistor.

In a second mode of operation, the RF isolation switch circuit is to be turned off. The first switch transistor electrically coupled between the bulk and the source of the main transistor is turned off. The second switch transistor is turned on so that the bulk is resistively coupled to the ground conductor. The bulk is therefore grounded. If the bulk of the main transistor were shorted to the source when the main transistor were turned off, and if a large peak-to-peak RF input signal were present on the source, then an intrinsic diode junction between the bulk and the drain might be forward biased or weakly forward biased so that the main transistor would leak through the forward biased bulk-to-drain junction of the main transistor. Decoupling the bulk from the source and resistively coupling the bulk to a ground conductor prevents this intrinsic diode junction from being forward biased.

The RF isolation switch circuit of the second aspect sees use in many applications including use between an output lead of a driver amplifier and a load that is to be selectively driven by the driver amplifier. The second aspect of selectably coupling the bulk of the main transistor either to the source of the main transistor (when the RF isolation switch circuit is to be on) or to a ground conductor (when the RF isolation switch circuit is to be off) is, in some embodiments, combined with the first aspect involving a gate-to-source shorting circuit. In a method of manufacture, the RF isolation switch circuits of the first and/or second aspects is/are fabricated using a 65 nanometer CMOS (Complementary Metal Oxide Semiconductor) semiconductor fabrication process.

The foregoing is a summary and thus contains, by necessity, simplifications, generalizations and omissions of detail; consequently, those skilled in the art will appreciate that the summary is illustrative only and does not purport to be limiting in any way. Other aspects, inventive features, and advantages of the devices and/or processes described herein, as defined solely by the claims, will become apparent in the non-limiting detailed description set forth herein.

DETAILED DESCRIPTION

Figure 1:
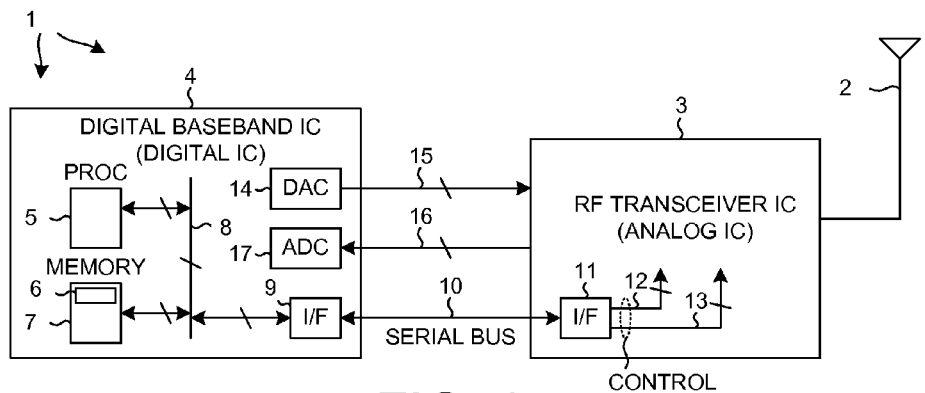
FIG. 1 is a diagram of a mobile communication device 1 that includes an RF isolation switch circuit in accordance with first aspect.

FIG. 1 is a diagram of a mobile communication device 1 that includes an RF isolation switch circuit in accordance with a first aspect. In this example, mobile communication device 1 is a multi-band cellular telephone handset. Device 1 includes (among other parts not illustrated) an antenna 2 usable for receiving and transmitting cellular telephone communications, an RF (Radio Frequency) transceiver integrated circuit 3, and a digital baseband processor integrated circuit 4. In some examples, the transceiver circuitry and the digital baseband circuitry are implemented on the same integrated circuit, but a two integrated circuit implementation is set forth here for illustration purposes.

Digital baseband integrated circuit 4 includes a processor 5 that executes a program 6 of processor-executable instructions. Program 6 is stored in a processor-readable medium 7 that in this case is a semiconductor memory. Processor 5 accesses memory 7 via local bus 8. Processor 5 interacts with and controls the RF transceiver integrated circuit 3 by sending control information to integrated circuit 3 via serial bus interface 9, serial bus 10, serial bus interface 11, and groups of control conductors 12 and 13. Information to be transmitted is converted into digital form on digital baseband processor integrated circuit 4 by a Digital-to-Analog Converter (DAC) 14 and is communicated across conductors 15 to the transmitter portion of transceiver integrated circuit 3. Data received by the receiver portion of transceiver integrated circuit 3 is communicated in the opposite direction across conductors 16 from RF transceiver integrated circuit 3 to digital baseband processor integrated circuit 4 and is converted into digital form by an Analog-to-Digital Converter (ADC) 17.

Figure 2:
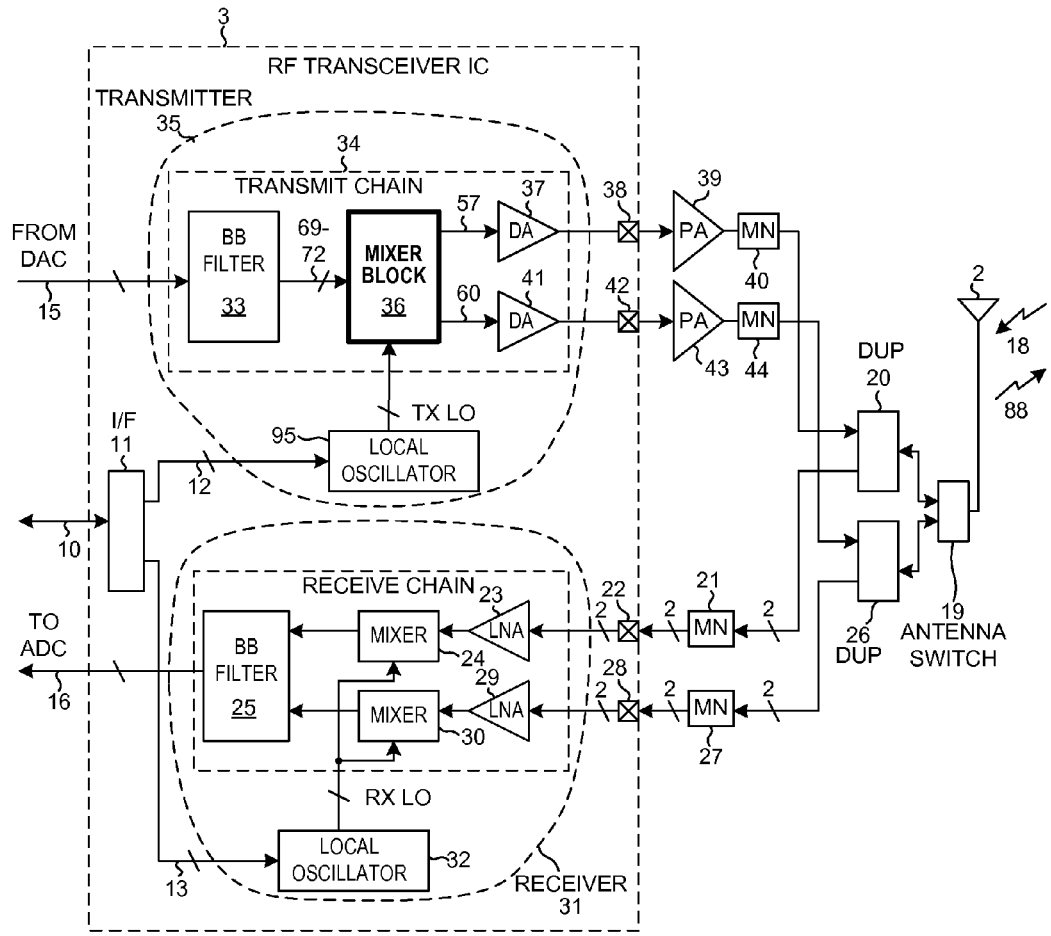
FIG. 2 is a more detailed diagram of the transceiver and antenna parts of the mobile communication device 1 of FIG. 1.

FIG. 2 is a more detailed diagram of the transceiver and antenna parts of the cellular telephone of FIG. 1. In one very simplified explanation of the operation of the cellular telephone, if the cellular telephone of FIG. 1 is being used to receive information as part of a cellular telephone call, then an incoming transmission 18 is received on antenna 2. The incoming signal passes through an antenna switch 19, and then passes through one of two receive paths of a wideband receiver portion 31 of the RF transceiver integrated circuit 3. In one path, the incoming signal passes through duplexer 20, a matching network 21, terminals 22, a Low Noise Amplifier (LNA) 23, a mixer 24, a baseband filter 25, and conductors 16 to the ADC 17 within digital baseband processor integrated circuit 4. In another path, the incoming signal passes through antenna switch 19, duplexer 26, matching network 27, terminals 28, LNA 29, mixer 30, baseband filter 25, and conductors 16 to the ADC 17 of the digital baseband processor integrated circuit 4. A local oscillator 32 (also referred to as a frequency synthesizer) supplies a receive local oscillator signal RX LO to the mixers 24 and 30. How the receiver downconverts is controlled by changing the frequency of the local oscillator signal RX LO and by selecting the appropriate receive path. One of the receive paths is used to receive signals in a first frequency band whereas the other of the receive paths is used to receive signals in a second frequency band.

If, on the other hand, cellular telephone 1 is being used to transmit information as part of a cellular telephone call, then the information to be transmitted is converted into analog form by DAC 14 in digital baseband processor integrated circuit 4. The analog information is supplied to a baseband filter 33 of a transmit chain 34 portion of a transmitter portion 35 of the RF transceiver integrated circuit 3. After filtering by the baseband filter, the signal is upconverted in frequency by a mixer block 36. The upconverted signal passes through one of two paths to antenna 2. In a first path, the signal passes through driver amplifier 37, terminal 38, power amplifier 39, matching network 40, duplexer 20, antenna switch 19, and to antenna 2 for transmission as transmission 88. In a second path, the signal passes through driver amplifier 41, terminal 42, power amplifier 43, matching network 44, duplexer 26, antenna switch 19, and to antenna 2 for transmission as transmission 88. Which of the two paths is used depends on whether the signal is to be transmitted in a first frequency band or in a second frequency band. How mixer block 36 upconverts is controlled by changing the frequency of the local oscillator signal TX LO generated by local oscillator 95 (also referred to as a frequency synthesizer) and by selecting the appropriate transmit path.

Figure 3:
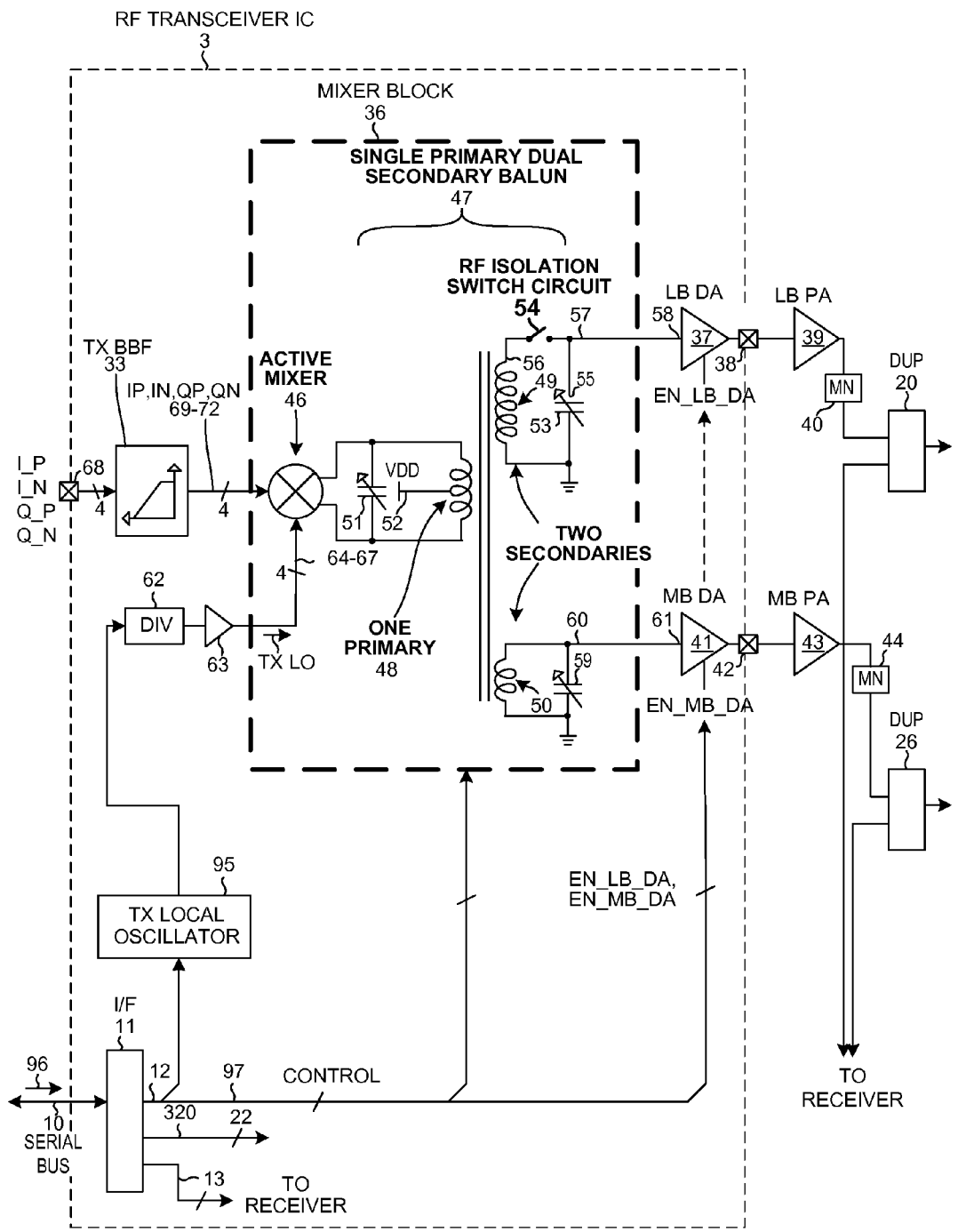
FIG. 3 is a more detailed diagram of certain parts of the RF transceiver integrated circuit 3 of FIG. 2.

FIG. 3 is a more detailed diagram of certain parts of the RF transceiver integrated circuit 3 of FIG. 2. Mixer block 36 is a mixer/balun circuit that includes an active mixer 46 and a balun 47. The balun is referred to here as a "single primary dual secondary balun" because it includes only one primary winding 48 but includes a first secondary winding 49 and a second secondary winding 50. The balun converts the differential signal output of the mixer 46 into single-ended signals that drive the driver amplifiers 37 and 41. The primary winding 48 is electromagnetically coupled to the two secondary windings 49 and 50 so that the three windings together constitute a transformer. A first programmable variable capacitor 51 is coupled in parallel with primary winding 48 as illustrated. A center tap on primary winding 48 is coupled to a supply voltage conductor 52. A second programmable variable capacitor 53 is coupled in parallel with the first secondary winding 49. An RF isolation switch circuit 54 can be open or closed as explained in further detail below. If RF isolation switch circuit 54 is closed, then one lead 55 of capacitor 53 is coupled to a terminal 56 of the first secondary winding 49 such that the capacitor 53 is coupled in parallel with the first secondary winding 49. If RF isolation switch circuit 54 is open, then lead 55 of capacitor 53 is not coupled to terminal 56 and the capacitor 53 is not coupled in parallel with first secondary winding 49. Conductor 57 communicates a signal from the first secondary winding 49 to an input lead 58 of first driver amplifier 37. A third programmable variable capacitor 59 is coupled in parallel with the second secondary winding 50 as illustrated. Conductor 60 communicates a signal from the second secondary winding 50 to an input lead 61 of second driver amplifier 41.

Complex mutual inductance interactions between the three windings 48, 49 and 50 allow the primary winding to be tuned to resonate over an adequate tuning range (to resonate at the low band frequencies or at the mid band frequencies) without having to provide a large variable capacitor in parallel with the primary winding. When RF isolation switch circuit 54 is open and the circuit is operating at mid band frequencies there is substantially no current flow in the first secondary winding 49 and impact of the first secondary winding 49 on primary winding resonance and overall balun resonance is reduced. The mutual inductance effect on primary winding resonance and overall balun resonance is largely due to the relatively smaller inductance of the second secondary winding 50. When RF isolation switch circuit 54 is closed and the circuit is operating at low band frequencies, the primary winding 48 and the first secondary winding 49 of larger inductance interact strongly whereas the second secondary winding 50 of smaller inductance has only a weak influence on primary resonance and overall balun resonance. The quality factor of the tuned balun for any frequency in the wideband frequency range from 824 MHz to 1980 MHz is 6.0 or greater.

Although not shown in the simplified diagram of FIG. 2, a divider 62 and a buffer 63 are disposed in the signal path of the TX LO signal to the mixer 46. These circuits 62 and 63 are disposed close to mixer 46. The TX LO signal as output from buffer 63 actually involves two differential signals TX LO_I and TX LO_Q that are in quadrature relation to one another. In-phase local oscillator signal TX LO_I is communicated to mixer 46 via two conductors 64 and 65. Quadrature phase local oscillator signal TX LO_Q is communicated to mixer 46 via two conductors 66 and 67.

Reference numeral 68 represents four terminals of integrated circuit 3 through which two differential signals I_ and Q_ are received. I_P and I_N constitute the differential signal I. Q_P and Q_N constitute the differential signal Q. The transmit baseband filter 33 supplies two differential filtered signals via conductors 69-72 to active mixer 46. IP and IN constitute the first differential signal. QP and QN constitute the second differential signal. Digital control bits from serial bus interface 11 are communicated via some of the control conductors 12 to mixer block 36. These control conductors 97 are shown in further detail in FIG. 4.

Figure 4:
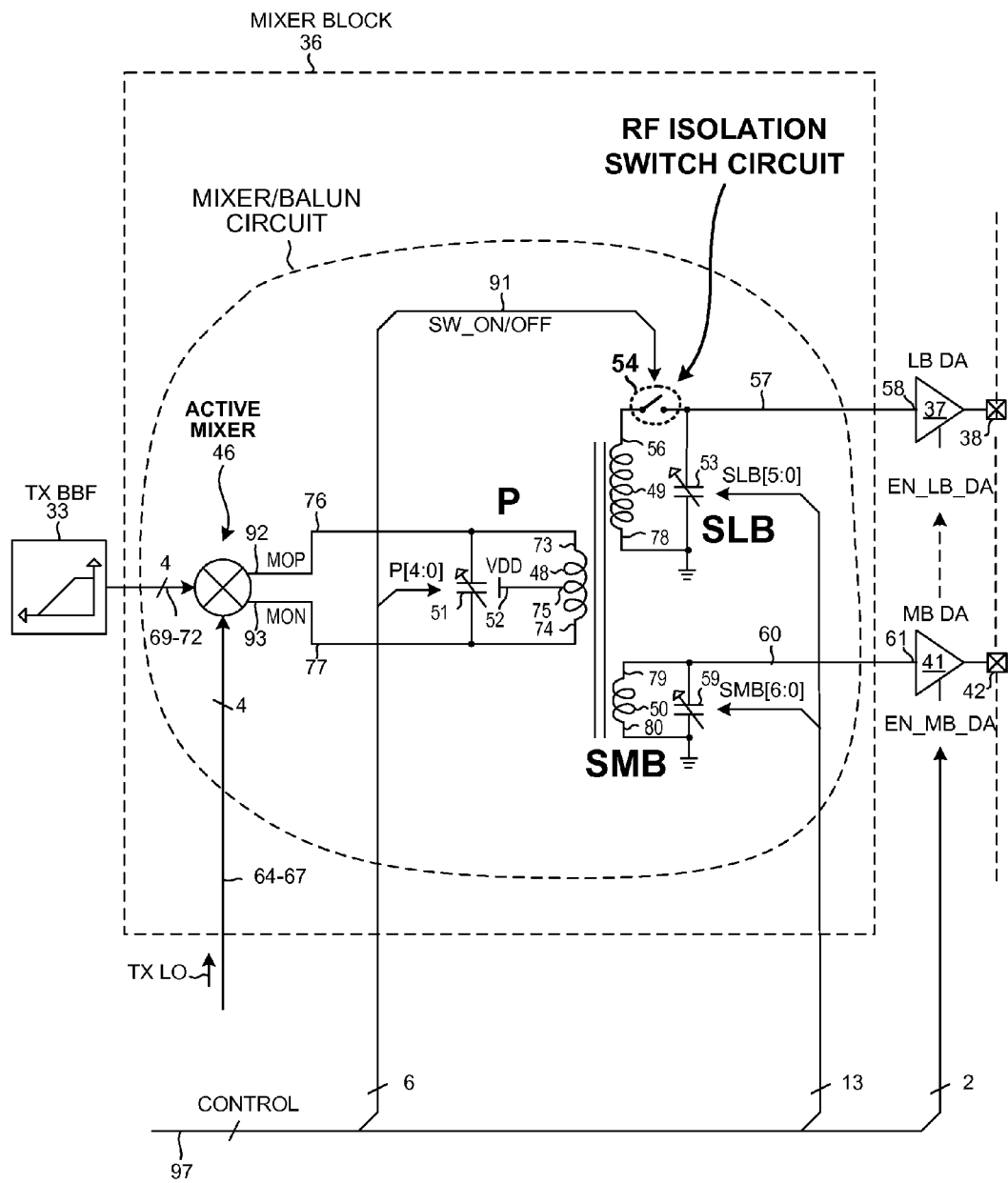
FIG. 4 is a circuit diagram that shows the mixer/balun circuit of FIG. 3 in further detail.

FIG. 4 is a circuit diagram that shows the mixer/balun circuit in further detail. Reference numerals 73 and 74 identify terminals of primary winding 48. Reference numeral 75 identifies the center tap of primary winding 48. The differential mixer output signal MOP and MON from mixer 46 is supplied via a corresponding pair of conductors 76 and 77 to primary winding 48. Signal MOP is supplied from mixer output lead 92 onto terminal 73 of the primary winding. Signal MON is supplied from mixer output lead 93 onto terminal 74 of the primary winding. The capacitance of the first programmable variable capacitor 51 is controlled by the five-bit digital value P[4:0]. Reference numerals 56 and 78 identify terminals of first secondary winding 49. The capacitance of the second programmable variable capacitor 53 is controlled by the six-bit digital value SLB[5:0]. Signal SW_ON/OFF is a single digital control bit signal on conductor 91 that controls RF isolation switch circuit 54. Reference numerals 79 and 80 identify terminals of the second secondary winding 50. The capacitance of the third programmable variable capacitor 59 is controlled by the seven-bit digital value SMB[6:0]. Reference numeral 97 identifies the control conductors that communicate the control values P[4:0], SW_ON/OFF, SLB[5:0], SMB[6:0], EN_LB_DA, and EN_MB_DA. In operation, the digital baseband processor integrated circuit 4 sends digital information 96 (see FIG. 3) across serial bus 10 to RF transceiver integrated circuit 3. This digital information 96 is received onto RF transceiver integrated circuit 3 from the serial bus 10. The digital information 96 either contains or is used to generate the digital control signals (P[4:0], SW_ON/OFF, SLB[5:0], SMB[6:0], EN_LB_DA, and EN_MB_DA) that control the mixer/balun circuit and the driver amplifiers so that these circuits are properly configured to operate at the desired transmitting frequency.

Figure 5:
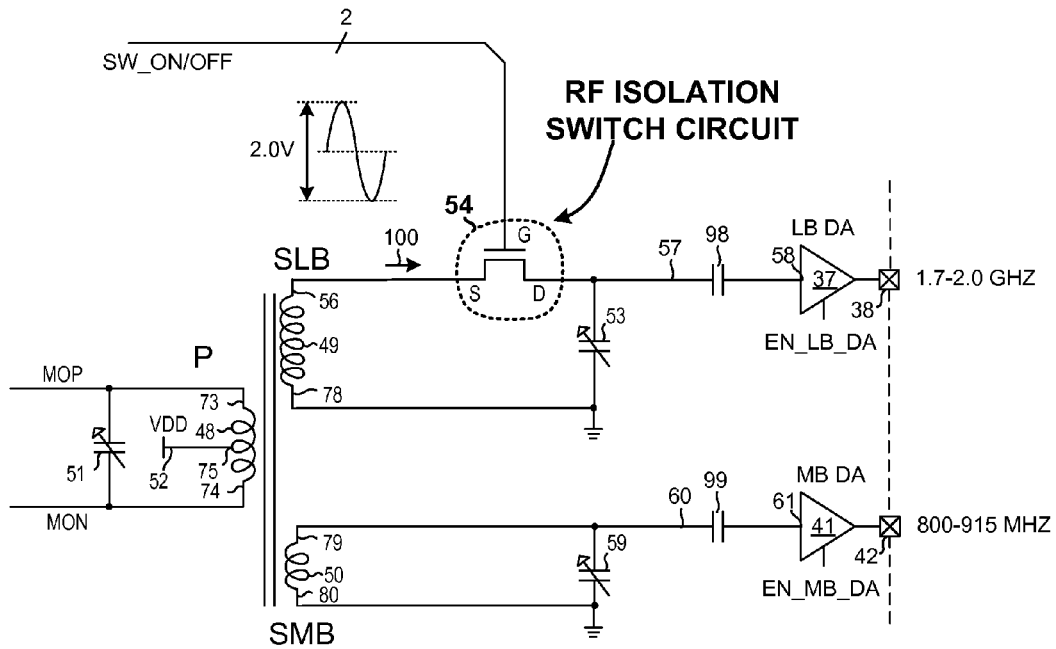
FIG. 5 is a more detailed diagram of the RF isolation switch circuit of FIG. 4.

FIG. 5 is a more detailed diagram of the RF isolation switch circuit 54 of FIG. 4. Capacitor symbols 98 and 99 represent decoupling capacitances that isolate DC voltages on the secondary windings 49 and 50 from reaching the DA input leads 58 and 61, respectively. When the transmitter is configured to transmit in the higher midband frequency range using MB DA 41, then the low band driver amplifier (LB DA) 37 is disabled. Conversely, when the transmitter is configured to transmit in the lower frequency band LB using the LB DA 37, then the MB DA 41 is disabled. The natural oscillating frequency of the overall balun circuit is a function of the total capacitance coupled to the balun. The overall parasitic capacitance of the MB path coupled across second secondary winding 50 has an effect on the natural oscillating frequency of the overall balun circuit when the circuit is operating in the LB frequency mode, but the effect of the parasitic capacitances of the MB path on balun oscillation in the lower frequency LB range is tolerable because the side point frequency is lower. The oscillating frequency of the overall balun in the low band is a function of the combined capacitances on the LB secondary as well as the combined capacitances on the MB secondary. When the circuit is operating in the higher frequency MB frequency range, however, the parasitic capacitance of the LB circuitry across first secondary winding 49 should not be allowed to lower the natural oscillating frequency of the overall balun circuit appreciably. If there were no RF isolation switch circuit 54, then the overall capacitance of the LB path would affect MB DA operation through the balun and reduce the oscillating frequency of the balun circuit. RF isolation switch circuit 54 is provided to isolate the LB signal path capacitances from the balun during MB operation, and to couple capacitor 53 in parallel with first secondary winding 49 during LB operation.

Figure 6:
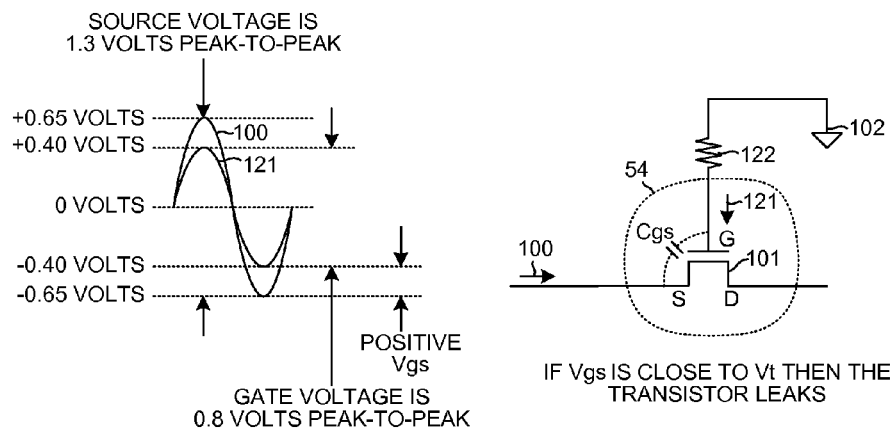
FIG. 6 is a diagram of an RF isolation switch circuit that is implemented as a thin gate dielectric N-channel transistor.

FIG. 6 is a diagram of RF isolation switch circuit 54 that is implemented as a thin gate dielectric N-channel transistor 101. As compared to implementing the RF isolation switch circuit as a single thick gate dielectric transistor, a thin gate dielectric transistor 101 is used. This allows the device channel length to be smaller, the overall device size to be smaller. This allows the overall parasitic capacitance on the first secondary winding 49 when the switch is off to be lower. When the switch is off and the circuit is operating in the MB mode, the parasitic capacitance of the RF switch that loads the mid-band path (through the balun) should be small. Reducing this parasitic capacitance is accomplished by making the RF switch circuit a thin gate dielectric transistor. The thin gate dielectric transistor has a lower threshold voltage as compared to a thick gate dielectric device. The threshold voltage of RF switch circuit 54 of FIG. 6 may, for example, be 0.38 volts under conditions of a fast-fast process when operating at 110 degrees Celsius (FF10). The RF signal 100 as output by the first secondary winding 49 onto the source of switch circuit 54 has a large peak-to-peak signal voltage amplitude that can be as large as 1.3 volts and has a zero volt DC voltage component. To turn the switch circuit 54 of FIG. 6 off, the gate of transistor 101 is grounded by coupling the gate to a ground conductor 102 through a large resistance 122. The bulk node (the term "bulk" refers to a P-well into which the N-type source and drains of transistor 101 are formed) of the RF switch 54 is also typically connected to ground using a resistance in order to protect the bulk node of the RF switch when it is off. Due to a parasitic capacitance Cgs, the voltage on the gate also has a sinusoidal shape and follows the AC signal on the source, but the peak-to-peak magnitude of the gate voltage signal 121 is less at around 0.8 volts peak to peak. The gate voltage signal also has a zero volt DC component. When the voltage of the RF signal 100 on the source of transistor 101 is at its minimum value of minus 0.65 volts at the bottom of the illustrated sine wave, then the gate voltage on the gate of the switch circuit 54 may be at approximately minus 0.4 volts, and the Vgs of the switch circuit 54 of FIG. 6 is positive and may be adequately close to the 0.38 volt threshold voltage Vt of the thin gate dielectric transistor 101 to cause transistor 101 to leak. The label RF in the term RF signal as the term is used here indicates that the signal has a frequency of at least 500 MHz.

Figure 7:
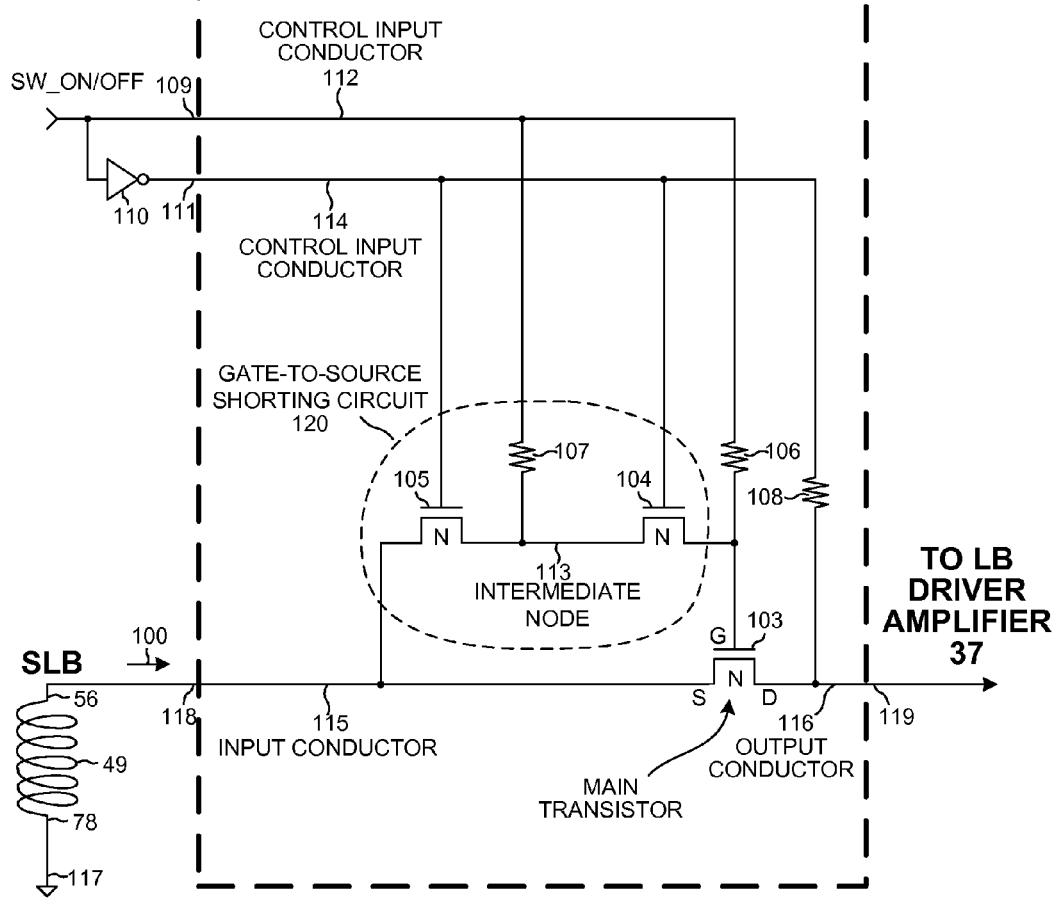
FIG. 7 is a circuit diagram of an RF isolation switch circuit in accordance with a first aspect.

FIG. 7 is a circuit diagram of an embodiment of RF isolation switch circuit 54 involving a main transistor 103, a first turn-off path transistor 104, a second turn-off path transistor 105, and three resistors 106, 107 and 108. Turn-off transistors 104 and 105 and resistor 107 form a gate-to-source shorting circuit 120. The control signal SW_ON/OFF is received onto input lead 109 and its digital logic complement is generated by inverter 110 and is received onto input lead 111. The inverter may be located in the RF isolation switch circuit in some embodiments such that there is only one control input lead.

The control signal SW_ON/OFF is supplied via control input conductor 112 and resistor 106 onto the gate of main transistor 103 and onto intermediate node 113. Conductor 112 in this case is the same conductor as conductor 91 in FIG. 4. The complementary signal is supplied via control input conductor 114 onto the gates of turn-off transistors 104 and 105. Signal SW_ON/OFF is a digital control signal that either has a digital logic low level voltage of ground potential or the voltage of the supply voltage VDD. Ground potential in this case is zero volts and the VDD supply voltage is 1.3 volts. Conductor 115 is a signal input conductor. Conductor 116 is a signal output conductor. In one example, main transistor 103 is a 720 micron by 60 (W/L) nanometer thin gate dielectric N-channel transistor having a gate-to-source parasitic capacitance of approximately 0.4 pF. The threshold voltage Vt of transistor 103 ranges from approximately 0.38 volts at process corner FF110, to a typical value of 0.5 volts, to a highest value of approximately 0.6 volts at process corner SS-30. Turn-off transistors 104 and 105 are 24 micron by 60 nanometer (W/L) N-channel transistors. The sources and drains of the N-channel transistors extend down into a P-well (bulk), that in turn extends down into a deep N-well, that in turn intends down into the P-type substrate. Resistor 107 has a resistance of 20 k ohms Resistor 106 has a resistance of 140 k ohms Resistor 108 has a resistance of 10 k ohms.

When the signal SW_ON/OFF has a digital logic low level, then RF isolation switch circuit 54 is to be off. The digital logic level high signal on conductor 114 causes turn-off transistors 104 and 105 to be turned on. Intermediate node 113 between turn-off transistors 104 and 105 is coupled and pulled down to ground potential via resistor 107. The signal on the gate of main transistor 103 can be thought of as having a DC component and an AC component. The DC component is zero volts and is supplied onto the gate of the main transistor 103 through resistor 106. The DC voltage component of the source of the gate of main transistor 103 is also zero volts due to the first secondary winding 49 coupling input conductor 115 to ground node 117 for AC signal purposes. Reference numeral 118 identifies the RF signal input lead of the RF isolation switch circuit. The DC ground potential received via first secondary winding 49 is also coupled to the gate of the main transistor 103 by the gate-to-source shorting circuit 120. In this illustrative example, the AC component of the signal on conductor 115 is a 1.3 volt peak-to-peak sinusoidal AC signal. This 1.3 volt peak-to-peak sinusoidal AC signal is also coupled through turn-off transistors 105 and 104 onto the gate of main transistor 103 so that the AC signal swing on the gate of main transistor 103 follows the AC signal swing of the signal on the source of the main transistor 103 and is of the same peak-to-peak magnitude. Accordingly, when the voltage on conductor 115 is plus 0.65 volts, then the voltage on the gate of main transistor 103 is also plus 0.65 volts. When the voltage on conductor 115 is minus 0.65 volts, then the voltage on the gate of main transistor 103 is also minus 0.65 volts. Main transistor 103 therefore never experiences a positive Vgs and main transistor 103 remains off throughout the period of the AC signal. Similarly, when SW_ON/OFF is a digital logic level low, then the supply voltage VDD is coupled onto output conductor 116 and the RF signal output lead 119 via resistor 108. Due to gate of main transistor 103 being coupled to ground potential via resistor 106 and due to the drain of main transistor 103 being coupled to supply voltage VDD via resistor 108, there can never be a positive DC voltage across the gate-to-drain junction of main transistor 103. This ensures that the gate-to-drain junction is not forward biased.

When SW_ON/OFF is a digital logic level high voltage, then RF isolation switch circuit 54 is to be on. When SW_ON/OFF is a digital logic level high, then turn-off transistors 105 and 104 are turned off and intermediate node 113 between them is coupled to supply voltage VDD via resistor 107. When SW_ON/OFF is a digital logic level high, then the gate of main transistor 103 is supplied with a 1.3 volt DC digital logic high voltage level via resistor 106. There is only a small AC signal component on the gate of main transistor 103. For a VDD supply voltage of 1.3, a positive Vgs of at least 0.4 volts is therefore present across the gate-to-source junction of main transistor 103 despite the 1.3 volt peak-to-peak signal being present on the source of main transistor 103. Main transistor 103 remains on throughout the 1.3 volt peak-to-peak cycle of the signal on conductor 115. Similarly, when SW_ON/OFF is a digital logic level high, then ground potential is coupled onto output conductor 116 via resistor 108. Due to gate of main transistor 103 being driven to VDD and due to ground potential being present on the drain of main transistor 103, a positive Vgd remains across main transistor 103 to keep the gate-to-drain junction turned on.

Two turn-off transistors 105 and 104 are provided as opposed to one, because if only one turn-off switch were provided to disconnect the path between the gate and source of main transistor 103, then that one turn-off transistor may leak when it is to be turned off due to the same phenomenon described above in connection with FIG. 6. For example, in normal operation when SW_ON/OFF is high and the gate of turn-off transistor 104 is at ground potential, the source of this turn-off transistor 104 would experience the full large signal swing on conductor 115 and would be weakly turned on at the bottom of the voltage swings of the AC signal on conductor 115 if turn-off transistor 105 were not provided. Providing turn-off transistor 105 in the signal path between conductor 115 and the source of turn-off transistor 104 reduces the magnitude of the voltage swing on the source of turn-off transistor 104 and allows turn-off transistor 104 to remain totally off. Turn-off transistor 105 may leak, but turn-off transistor 104 is totally off, and this substantially isolates and decouples the AC signal on conductor 115 from the gate of the main transistor 103.

Figures 8, 9:
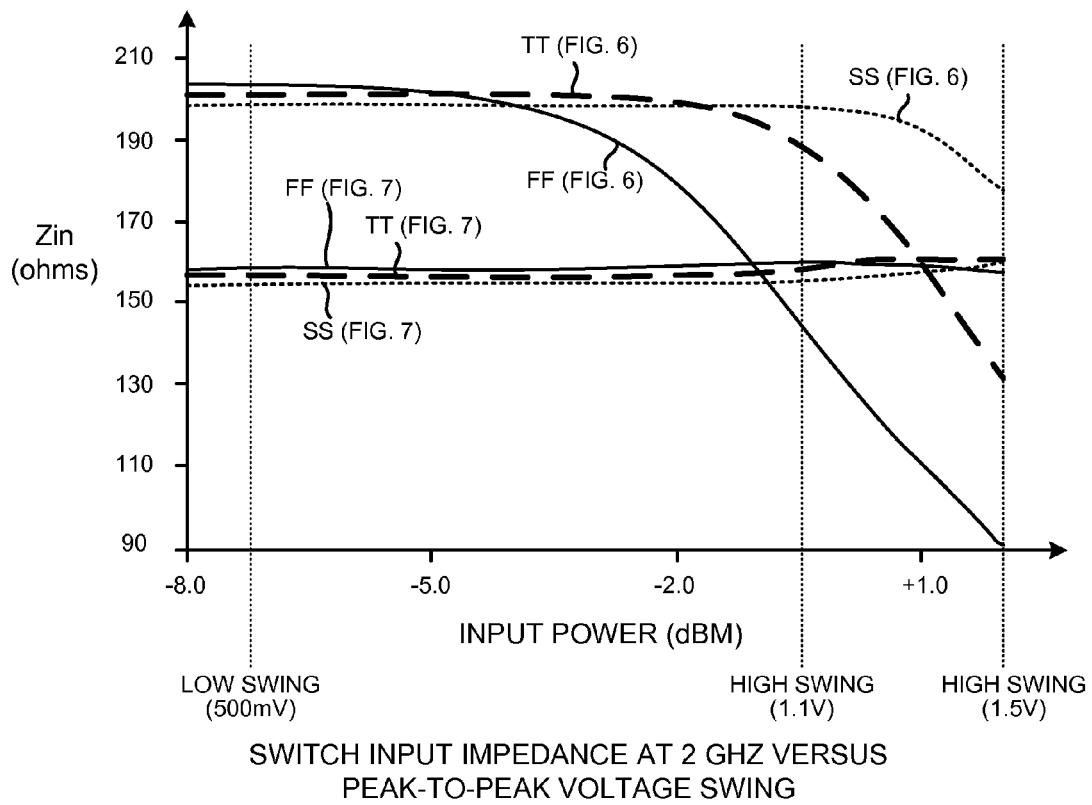
FIG. 8 is a diagram that shows how the input impedance (Zin) looking into the RF signal input lead of the RF isolation switch circuit of FIG. 7 changes as a function of the peak-to-peak voltage amplitude of the RF input signal.
FIG. 9 is a table that compares the performance of the RF isolation switch circuit of FIG. 7 with the performance of the simple RF switch of FIG. 6.

FIG. 8 is a diagram that shows how the input impedance (Zin) looking into the RF signal input lead 118 of the RF isolation switch circuit 54 of FIG. 7 changes as the peak-to-peak voltage swing of a 2 GHz signal as output by the first secondary winding 49 increases from approximately 500 mV peak-to-peak to approximately 1.5 volts peak-to-peak. The diagram also shows how the input impedance (Zin) of the simple RF switch of FIG. 6 in the same circuit would change over the same peak-to-peak input signal voltage swing. Note that the input impedance of the RF isolation switch circuit of FIG. 7 remains substantially constant even at high input signal peak-to-peak voltage swings of 1.5 volts, whereas the simple single-transistor RF switch of FIG. 6 exhibits substantial leakage at high input signal peak-to-peak voltage swings.

FIG. 9 is a table that compares the performance of the RF isolation switch circuit 54 of FIG. 7 with the performance of the simple single-transistor RF switch of FIG. 6. The "TT70" appearing in the column labeled CORNER indicates a typical process and a typical operating temperature of 70 degrees Celsius. The "FF110" appearing in the column labeled CORNER indicates a fast process and a high operating temperature of 110 degrees Celsius. The ACLR measurement is of the entire TX signal path from a point before the base band filter to the output of the driver amplifier. The "P1 dB" value is a measure of linearity. As output power of the TX signal path increases, the gain of TX signal path is seen to decrease at some higher output power. The P1 dB value is the output power at which the gain of the entire TX signal path is seen to exhibit a one dB gain loss. Note that with a fast process and at high temperatures where the threshold voltage of a thin dielectric transistor would be lowest, the P1 dB value of the simple RF circuit of FIG. 6 drops to 9.01 dB, whereas the P1 dB of the circuit of FIG. 7 remains high at 11.89 dB.

Figure 10:
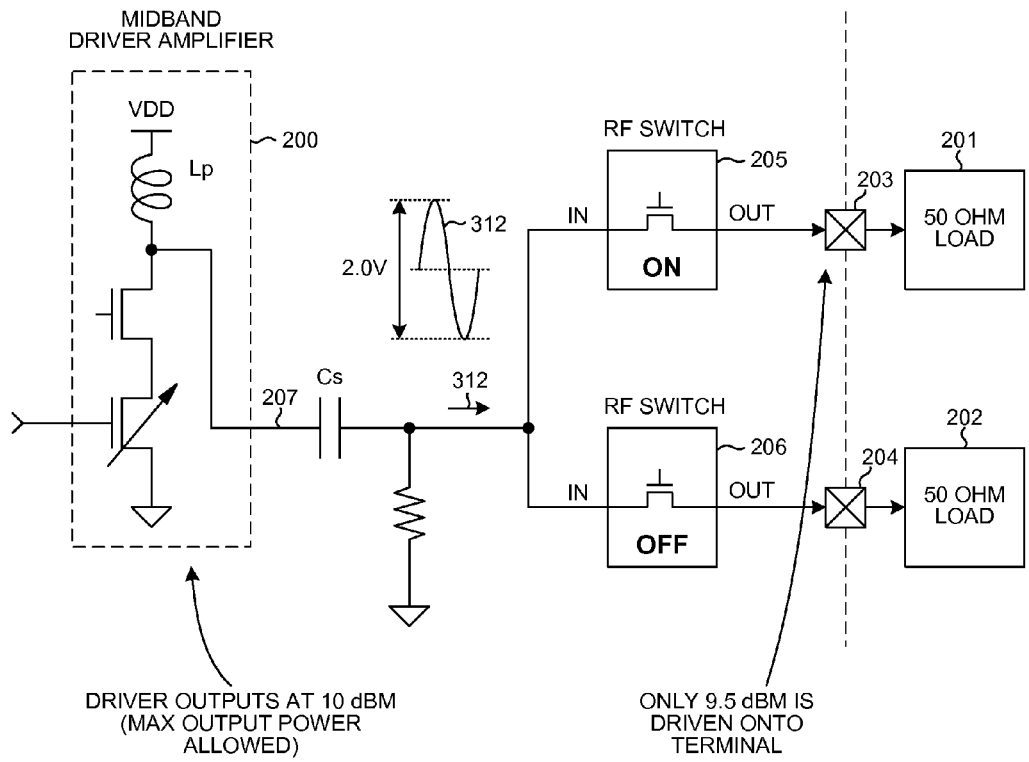
FIG. 10 is a diagram of a circuit involving two simple single-transistor RF switches.

FIG. 10 is a diagram of a circuit involving two simple RF switches. Block 200 represents a driver amplifier such as one of the driver amplifiers 37 or 41 of FIGS. 1-5. Driver amplifier 200 is to supply its output signal to a selected one of two fifty ohm loads 201 or 202 via a corresponding pair of terminals 203 and 204. Only one of the two RF switches 205 and 206 should be on at a time. The other switch should be off and should not leak. If, for example, a relatively high 2.0 volt peak-to-peak voltage signal 312 is output from the driver amplifier 200 onto conductor 207, and if a conventional RF switch were used for switch blocks 205 and 206, then the switch that is to be off would leak due to the phenomenon described above in connection with FIG. 6. As a result, some of the power as output by the driver amplifier would be supplied onto the wrong output terminal. There may be maximum output power constraints on the driver amplifier, and it may be desired to supply substantially all of the power as output by the driver amplifier to the desired terminal so that the output power of the driver amplifier can be maintained below the allowed amount of maximum output power. In the circuit of FIG. 10, switch 205 is controlled to be on, switch 206 is controlled to be off, and the driver amplifier 200 outputs at 10 dBM but only 9.5 dBM is supplied onto the terminal 203 due to leakage through switch 206.

One conventional approach to solving the problem of FIG. 10 is to use a single thick gate dielectric N-channel transistor for each of RF switches 205 and 206. If the signal swing on the input lead of the RF switch is not too high, then this approach can be used to achieve a suitably low Ron through the RF switch, but the size of the thick gate dielectric transistor of the RF switch must generally be made about three times larger than if a thin gate dielectric transistor were used to realize the RF switch. This consumes about ten times as much integrated circuit area and increases parasitic capacitance loading on the driver amplifier output five fold, and generally degrades the linearity of the driver amplifier.

Figure 11:
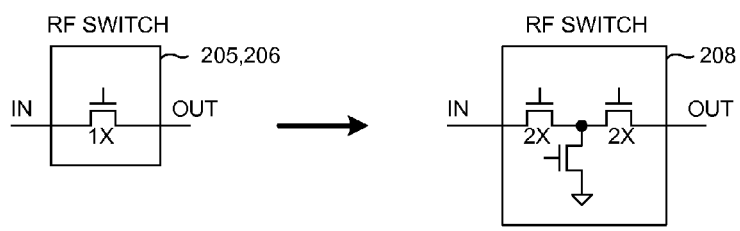
FIG. 11 is a diagram that illustrates a conventional approach to solving a problem associated with the circuit of FIG. 10.

FIG. 11 is a diagram that illustrates a conventional approach to solving the problem of FIG. 10. Rather than using one 1× size thick gate dielectric N-channel transistor to realize the RF switches 205 and 206, the same low gain loss through the switches is achieved by using two larger 2× thin gate dielectric N-channel transistors in the T-switch configuration 208 illustrated in FIG. 11. The T-switch topology 208, however, increases the amount of parasitic capacitance loading on the driver amplifier output, decreases linearity of the driver amplifier, and consumes an undesirably large amount of integrated circuit area.

Figure 12:
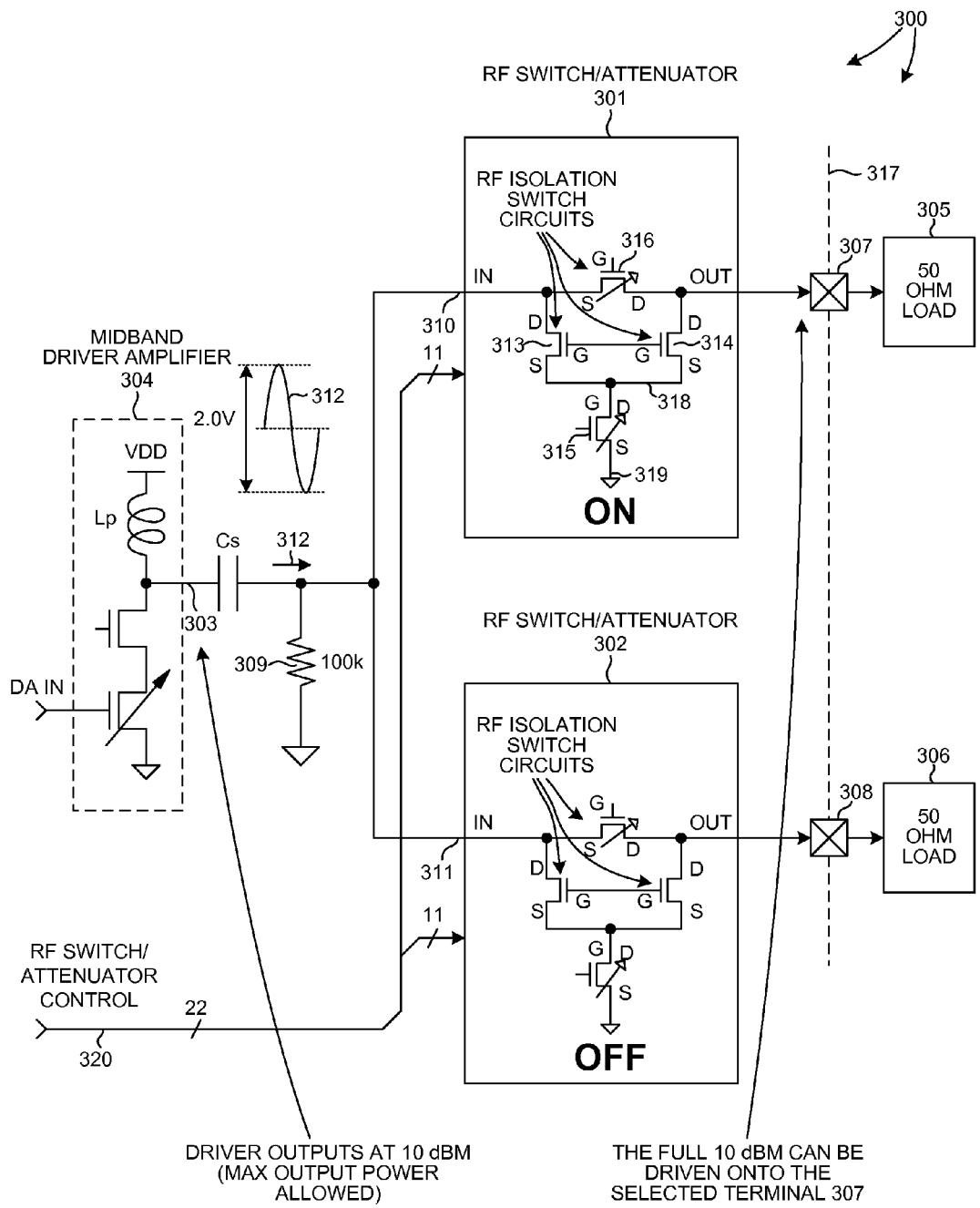
FIG. 12 is a diagram of a circuit in which the RF isolation switch circuit of FIG. 7 is used to realize a pair of software programmable and controllable RF switch/attenuator circuits.

FIG. 12 is a diagram of a circuit 300 in which two programmable RF switch/attenuator circuits 301 and 302 are provided to couple the output lead 303 of a driver amplifier 304 to a selected one of two fifty ohm loads 305 and 306 via two terminals 307 and 308. The driver amplifier 304 is shown in simplified form. A resistor 309 is provided to DC bias the inputs leads 310 and 311 of the attenuators to ground potential. A large RF signal 312 (for example, 2.0 volts peak-to-peak) exists on the input leads 310 and 311 of the attenuators due to the large output power of the driver amplifier 304. The driver amplifier 304 may be a driver amplifier in the RF transceiver integrated circuit 3 of FIGS. 1 and 2, where such a driver amplifier is made to drive a selected one of a plurality of output terminals. Dashed line 317 in FIG. 12 represents the boundary of the RF transceiver integrated circuit.

The two programmable RF switch/attenuator circuits 301 and 302 are of identical construction, so only the components of RF switch/attenuator 301 are described here. Each of the two switch symbols 313 and 314 represents an instance of the RF isolation switch circuit of FIG. 7. Transistor symbol 315 represents a set of parallel-connected N-channel transistors, where a selected number of these transistors can be turned on to couple node 318 to a ground conductor 319. Switch symbol 316 represents multiple instances of the RF isolation switch circuit of FIG. 7 coupled together in parallel, where a selected number of those RF isolation switch circuits can be turned on. Whether the programmable RF switch/attenuator circuit 301 is on and the amount of attenuation provided by the programmable RF switch/attenuator circuit 301 is digitally programmable by an eleven-bit digital attenuator control value received via eleven of the twenty-two conductors 320.

The use of programmable RF switch/attenuator circuits 301 and 302 allows the driver amplifier 304 to achieve improved phase noise performance (higher SNR) at the selected one of the output terminals 307 and 308. It is generally better in terms of phase noise performance to drive the driver amplifier harder and to consume more supply current in the driver amplifier but to supply less of the driver amplifier output power to the selected terminal as compared to driving the driver amplifier less hard and supplying more of the driver amplifier output power to the selected output terminal. The use of attenuators 301 and 302 as opposed to simple single-transistor switches between the driver amplifier output lead 303 and the terminals 307 and 308 allows the driver amplifier to be driven harder with less loading in this way. Multiple attenuators are provided because different loads may be coupled to the RF transceiver integrated circuit, and these different loads may need to be driven with different amounts of power. The attenuators 301 and 302 in the circuit of FIG. 12 are individually disabled and enabled under control of the processor 5 in the digital baseband processor integrated circuit 4 via serial bus 10, bus interface 11, and conductors 320 so that the disabled attenuator is fully off and does not leak power to its load.

Figure 13:
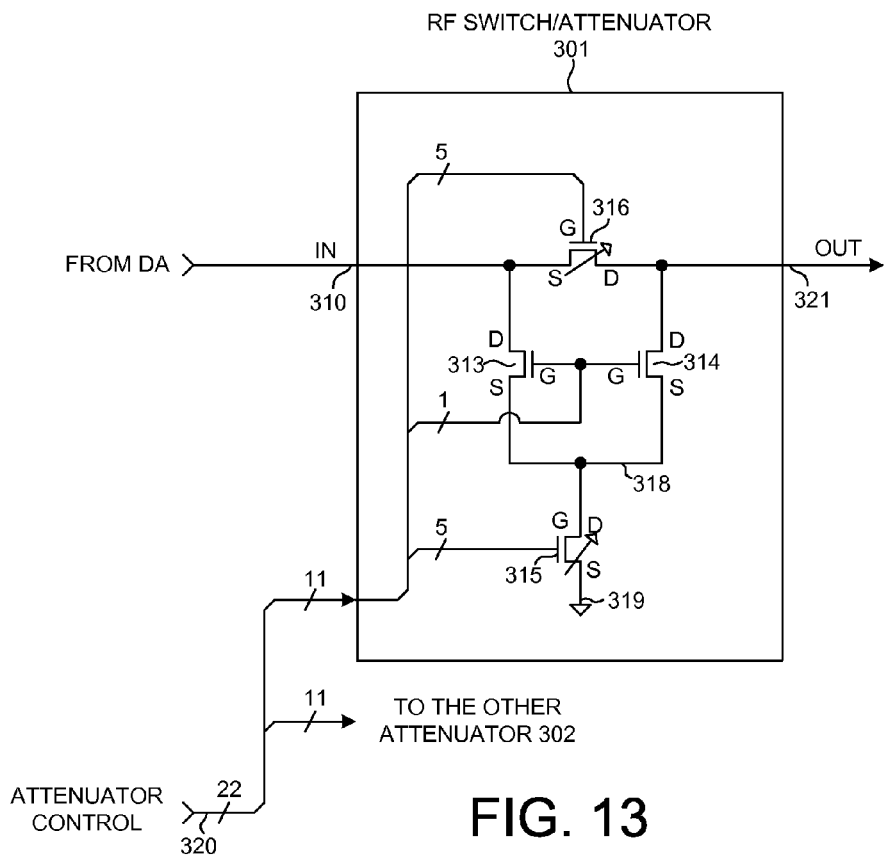
FIG. 13 is a more detailed diagram of one of the RF switch/attenuator circuits of FIG. 12.

FIG. 13 is a more detailed diagram of RF switch/attenuator 301. Reference numeral 310 identifies the RF signal input lead. Reference numeral 321 identifies the RF signal output lead. There are eleven digital control input conductors that extend into the RF switch/attenuator 301. Eleven of the twenty-two digital control input conductors 320 supply an eleven-bit digital control value to the RF switch/attenuator 301. Five of the bits control the five parallel-connected RF switches represented by symbol 316. If one of these bits is a digital logic low level (zero volts) then its corresponding RF isolation switch circuit is turned off whereas if the bit is a digital low high level (2.1 volts) then its corresponding RF isolation switch circuit is turned on. (The supply voltage VDD is 2.1 volts in the example of FIGS. 12 and 13 as compared to the VDD of 1.3 volts in the example of FIG. 7 and the main transistors of the RF isolation switch circuits in the example of FIGS. 12 and 13 are thick gate dielectric N-channel transistors as compared to the thin gate dielectric N-channel transistors used in the example of FIG. 7.) Similarly, five other of the eleven control bits are supplied to the parallel-connected N-channel transistors represented by symbol 315. If one of these bits is a digital logic low level (zero volts) then its corresponding N-channel transistor is turned off whereas if the bit is a digital low high level (1.3 volts) then its corresponding N-channel transistor is turned on. One bit is supplied onto the SW_ON/OFF control input leads of the RF isolation switch circuits 313 and 314. If this bit is a digital logic low level (zero volts) then the RF isolation switch circuits 313 and 314 are turned off whereas if this bit is a digital low high level (2.1 volts) then the RF isolation switch circuits 313 and 314 are turned on. To turn the RF switch/attenuator 301 off, all eleven bits are set to digital logic low levels (ground potential). To turn the RF switch/attenuator 301 on and to use it as an attenuator the two RF isolation switch circuits 313 and 314 are turned on, but a selected number of the parallel-connected RF isolation switch circuits 316 are turned on and a selected number of the parallel-connected N-channel transistors 315 are turned on. For more attenuation, a larger number of the pull-down N-channel transistors 315 are turned on and a smaller number of the parallel-connected RF isolation switch circuits 316 are turned on. For less attenuation, a smaller number of the pull-down N-channel transistors 315 are turned on and a larger number of the parallel-connected RF isolation switch circuits 316 are turned on. The eleven attenuator control bits that control RF switch/attenuator 301 and the eleven attenuator control bits that control RF switch/attenuator 302 are determined by processor 5 in the digital baseband processor integrated circuit 4 and are communicated to the attenuators 301 and 302 in the RF transceiver integrated circuit 2 via serial bus 10, bus interface block 11, and control conductors 320.

Figure 14:
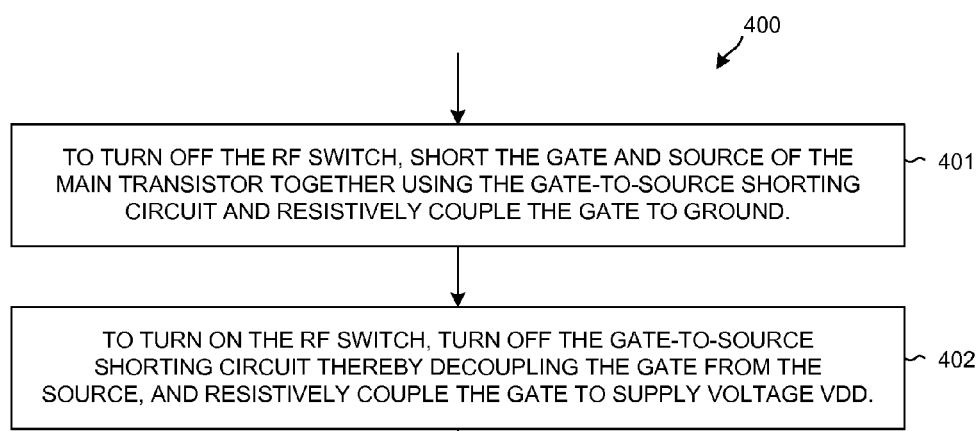
FIG. 14 is a flowchart of a method in accordance with the RF isolation switch circuit of FIG. 7.

FIG. 14 is a flowchart of a method 400 in accordance with the RF isolation switch circuit 54 of FIG. 7. To turn off the RF switch (step 401), the gate and source of the main transistor 103 are connected together using gate-to-source shorting circuit 120. The digital logic low signal on the control input conductor 112 is supplied via resistor 106 onto the gate of the main transistor 103. To turn on the RF switch (step 402), the gate-to-source shorting circuit 120 is turned off to decouple the source of the main transistor from the gate of the main transistor. The digital logic high signal on the control input conductor 112 is supplied via resistor 106 onto the gate of the main transistor 103. In one example, the gate-to-shorting circuit 120 includes the first and second turn-off transistors 104 and 105 and the resistor 107 interconnected as illustrated in FIG. 7. The description of the operation of the circuit above is a simplification. For a more accurate and detailed understanding of circuit operation, the circuit should be fabricated and tested and/or the circuit should be simulated using a circuit simulation program such as SPICE having accurate transistor models. In a method of manufacture, the RF transceiver integrated circuit 3 including RF isolation switch 54 is fabricated using TSMC's (Taiwan Semiconductor Manufacturing Company, Ltd.) 65 nanometer CMOS semiconductor fabrication process.

Figure 15:
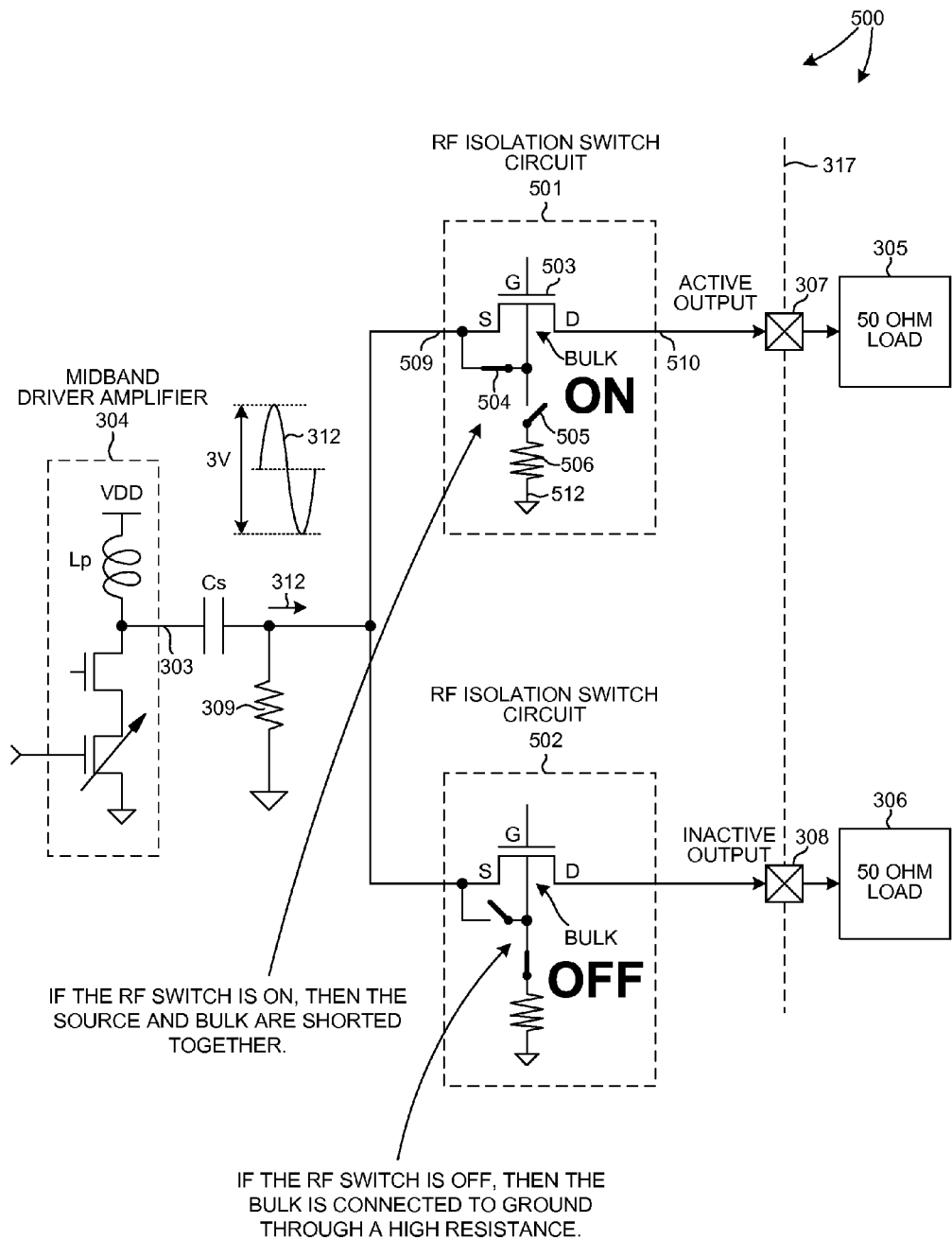
FIG. 15 is a diagram of a circuit that includes an RF isolation switch circuit in accordance with a second aspect.

FIG. 15 is a diagram of a circuit 500 involving RF isolation switch circuits 501 and 502 in accordance with a second aspect. The two programmable RF isolation switch circuits 501 and 502 are of identical construction, so only the components of RF isolation switch circuit 501 are described here. RF isolation switch circuit 401 includes a main N-channel transistor 503, two transistors switches 504 and 505, and a resistor 506 having a large resistance. Although the two switch transistors 504 and 505 are illustrated as switches, the switches are actually N-channel transistors. These N-channel transistors are controlled by digital control signals supplied onto the gates of the transistors.

If the RF isolation switch circuit 501 is controlled to be on, then the source and bulk electrodes of the main transistor 503 are shorted together. First switch 504 is closed and second switch 505 is open. The threshold voltage of the main transistor 503 is reduced if its bulk is shorted to its source. Accordingly, shorting the bulk to the source via first switch 504 reduces the threshold voltage of the main transistor. The effective gate voltage is therefore higher, and the main transistor 503 is on harder, and the drain-to-source resistance Rds through the main transistor is lower.

If RF isolation switch circuit 501 is controlled to be off, then first switch 504 is open and second switch 505 is closed so that the bulk electrode of the main transistor 503 is coupled to a ground conductor through resistor 506. In an RF isolation switch circuit that is controlled to be off and that has a relatively large voltage amplitude RF signal present on its source, an intrinsic diode junction between the bulk and the drain may become weakly forward biased if the source were to remain shorted to the bulk. Such forward biasing of the intrinsic bulk-to-drain diode would result in undesirable leakage through the main transistor from bulk to drain. Accordingly, the first switch 504 is opened to decouple the source from the bulk, and the bulk is resistively coupled to ground potential on a ground conductor by turning on second switch 505. This prevents the intrinsic bulk-to-drain diode from becoming forward biased.

In the circuit 500 of FIG. 15, only a selected one of the RF isolation switch circuits 501 and 502 is controlled to be on so that the driver amplifier 304 can drive a selected one of the two loads 305 and 306. The other RF isolation switch circuit is controlled to be off and leaks very little power through to the unselected load. The circuit 500 of FIG. 15 is identical to the circuit 300 of FIG. 12, except that different RF isolation switch circuits are employed and the digital control signals to control them are different. In some embodiments, the second aspect involving selectably coupling the bulk of the main transistor either to the source (when the RF isolation switch circuit is to be on) or to ground (when the RF isolation switch circuit is to be off) is, in some embodiments, combined with the first aspect involving a gate-to-source shorting circuit.

Figure 16:
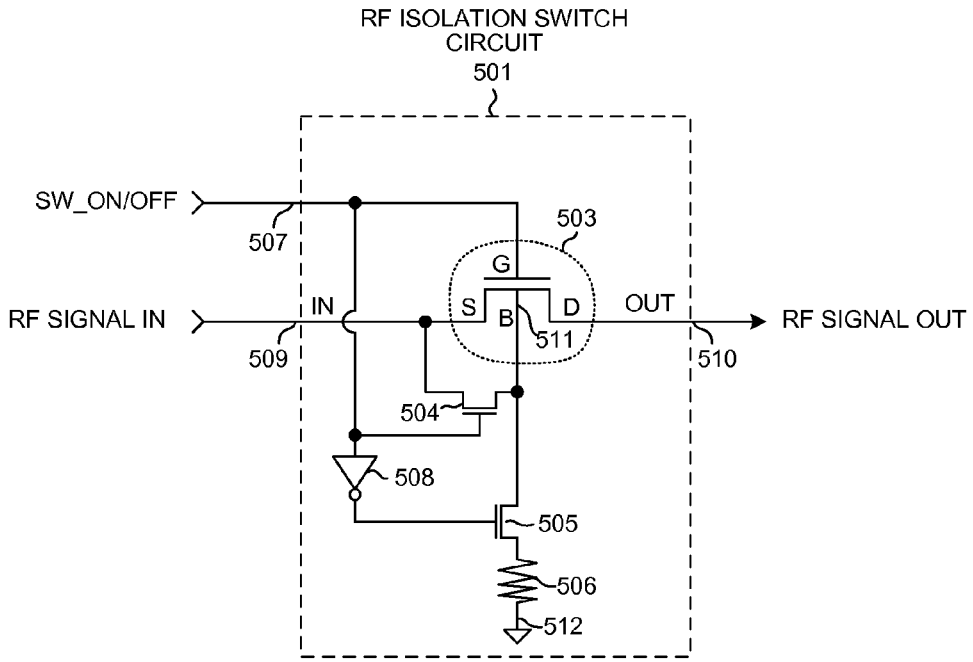
FIG. 16 is a more detailed diagram of the RF isolation switch circuit of FIG. 15.

FIG. 16 is a more detailed diagram of RF isolation switch circuit 501 of FIG. 15. The first and second switches 504 and 505 are realized as N-channel transistors. A SW_ON/OFF digital control signal received on control input lead 507 is supplied onto the gate terminal of the main transistor 503, onto the gate terminal of first switch transistor 504, and onto the input lead of inverter 508. Inverter 508 supplies a digital control signal of the opposite polarity to SW_ON/OFF onto the gate terminal of second switch transistor 505. Reference numeral 509 identifies the RF signal input lead of the RF isolation switch circuit. Reference numeral 510 identifies the RF signal output lead. Resistor 506 has a resistance of 36 k ohms Reference numeral 511 identifies the bulk electrode terminal of the main transistor 503. Reference numeral 512 identifies a ground conductor. In some examples, a 34 ohm resistor is disposed in series with the first switch transistor 504 so that when the bulk and source terminals of the main transistor are shorted together they are shorted together with approximately 34 ohms of resistance between them.

Figure 17:
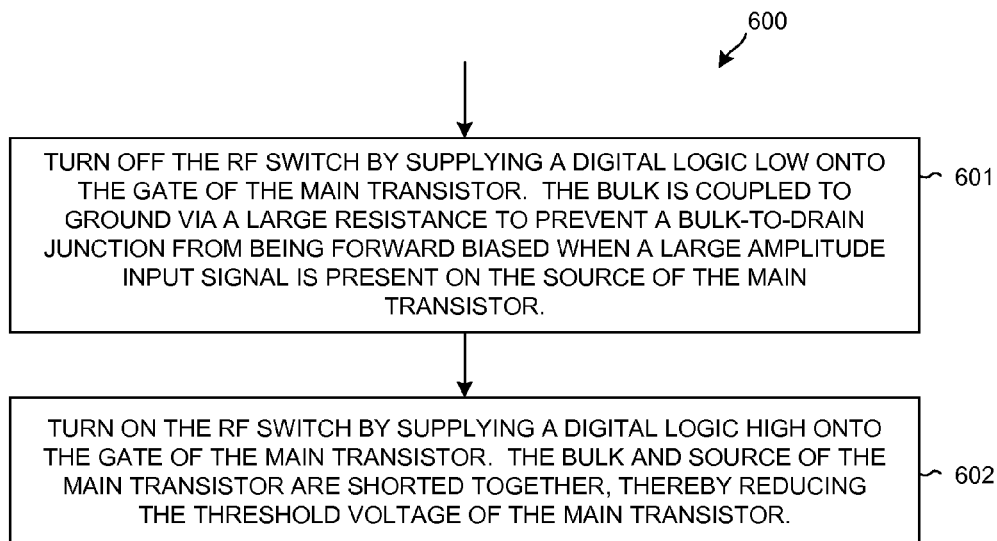
FIG. 17 is a flowchart of a method in accordance with the RF isolation switch circuit of FIG. 15.

FIG. 17 is a flowchart of a method 600 in accordance with the RF isolation switch circuit 501 of the second aspect. To turn off the RF isolation switch circuit (step 601), the gate terminal of the main transistor 503 is supplied with a digital logic low signal. First switch transistor 504 is turned off, and second switch transistor 505 is turned on to couple the bulk electrode (also referred to here as the bulk terminal) of the main transistor to ground conductor 512 via resistor 506. If the bulk terminal were coupled to the source terminal when the main transistor 503 were off and when a relatively large peak-to-peak voltage signal were present on the source terminal, then the intrinsic diode between the bulk and the drain of the main transistor could become forward biased. Grounding the bulk terminal to the ground conductor 512 via resistor 506 prevents this. To turn on the RF isolation switch circuit (step 602), the gate terminal of the main transistor 503 is supplied with a digital logic high signal. First switch transistor 505 is turned off, and second switch transistor 504 is turned on so that the bulk and source terminals of the main transistor 503 are shorted together. Shorting the source and bulk terminals together in this way reduces the threshold voltage of the main transistor. Larger peak-to-peak amplitude signals can be present on the source terminal of the main transistor without having a low Vgs that weakly turns off the main transistor during high peak portions of cycles of the incoming RF input signal. The larger effective Vgs on the main transistor reduces the source-to-drain on resistance of the main transistor when the RF isolation switch circuit is to be on.

Figure 18:
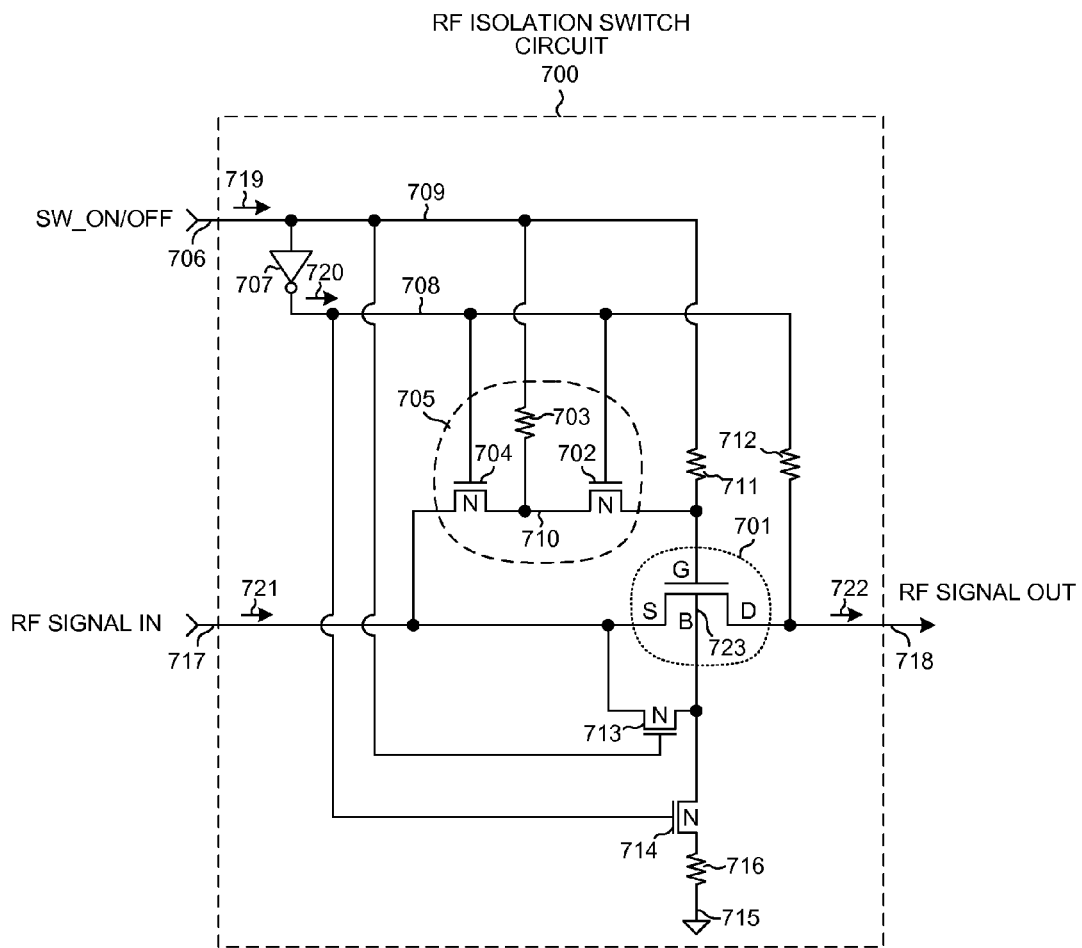
FIG. 18 is a diagram of an RF isolation switch circuit 700 that combines the first and second aspects.

FIG. 18 is a diagram of an RF isolation switch circuit 700 that combines the first and second aspects. Transistor 701 is the main transistor and is an N-channel field effect transistor having a source terminal, a drain terminal, a gate terminal, and a bulk terminal. The first turn-off transistor 702, the resistor 703, and the second turn-off transistor 704 form a gate-to-source shorting circuit 705. Input lead 706 is the input lead of the RF isolation switch circuit 700 that carries the digital switch on/off control signal SW_ON/OFF 719. Inverter 707 inverts the digital control signal SW_ON/OFF 719 and supplies the inverted resulting signal 720 onto conductor 708. SW_ON/OFF is present on conductor 709. The SW_ON/OFF signal is resistively coupled through resistor 703 onto intermediate node 710 of the gate-to-source shorting circuit 705 and is resistively coupled through resistor 711 onto the gate terminal of the main transistor 701, whereas the inverted version of the control signal is resistively coupled through resistor 712 onto the drain terminal of the main transistor 701. This portion of the circuit of FIG. 18 corresponds to the circuitry of FIG. 7 described above. In addition, the RF isolation switch circuit of FIG. 18 includes a first switch transistor 713 that shorts the bulk terminal 723 of the main transistor to the source terminal of the main transistor when the RF isolation switch circuit 700 is controlled to be on. The RF isolation switch circuit of FIG. 18 also includes a second switch transistor 714 that couples the bulk terminal 723 of the main transistor to a ground conductor 715 through resistor 716 when the RF isolation switch circuit 700 is controlled to be off. Switch transistors 713 and 714 and resistor 716 correspond to the circuitry of FIG. 16 described above. Input lead 717 is the RF signal input lead of the RF isolation switch circuit 700. An RF input signal 721 is received onto this input lead 717 from a source such as, for example, a mixer/balun or a driver amplifier in a radio transmitter. In one example, the RF input signal 721 is supplied from the mixer/balun of FIG. 3 and has a 1.3 volt peak-to-peak amplitude. In another example, the RF input signal 721 is supplied from the driver amplifier of FIG. 12 and has a 2.0 volt peak-to-peak amplitude. Output lead 718 is the RF signal output lead of the RF isolation switch circuit 700. If the main transistor 701 is on, then RF input signal 721 is conducted from input lead 717 through the RF isolation switch circuit and appears on the output lead 718 as RF output signal 722.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media. In one specific example, an RF isolation switch circuit in accordance with the first and/or second aspect is controlled by software and/or firmware executing in digital baseband processor integrated circuit 4. The software and/or firmware may, for example, be the program 6 of processor-executable instructions that is stored in processor-readable medium 7. Processor 5 executes this program 6 of instructions and as a result controls the RF isolation switch circuit(s) in RF transceiver integrated circuit 3 by sending appropriate digital control information across serial bus 10.

Although certain specific embodiments are described above for instructional purposes, the teachings of this patent document have general applicability and are not limited to the specific embodiments described above. The switches of the RF isolation switch circuit can be N-channel transistors as described above, or can be another type of switch including P-channel transistors or transmission gates or another type of transistor or switch circuit. The digital logic control signals that control the various switches of the RF isolation switch can have digital logic levels that are level shifted as compared to digital logic levels of other digital logic on the integrated circuit. One or more of resistors 106-108 and 506 can be omitted or replaced with another circuit component that accomplishes the resistive-coupling function. Accordingly, various modifications, adaptations, and combinations of the various features of the described specific embodiments can be practiced without departing from the scope of the claims that are set forth below.

What is claimed is:
1. An apparatus comprising:
a main N-channel transistor having a first terminal, a second terminal, and a gate terminal and configured for passing a Radio Frequency (RF) signal;
a first turn-off N-channel transistor having a first terminal, a second terminal, and a gate terminal, wherein the second terminal of the first turn-off N-channel transistor is coupled to the gate terminal of the main N-channel transistor;
a second turn-off N-channel transistor having a first terminal, a second terminal, and a gate terminal, wherein the second terminal of the second turn-off N-channel transistor is coupled to the first terminal of the first turn-off N-channel transistor, and wherein the first terminal of the second turn-off N-channel transistor is coupled to the first terminal of the main N-channel transistor; and
a first control conductor, wherein the main transistor is turned off when a first digital control signal on the first control conductor has a first digital logic value, and wherein the main transistor is turned on when the first digital control signal on the first control conductor has a second digital logic value opposite the first digital logic value.

2. The apparatus of claim 1, further comprising:
a first resistor having a first lead coupled to the gate of the main N-channel transistor and having a second lead coupled to the first control conductor.

3. The apparatus of claim 1, further comprising:
a second control conductor, wherein a second digital control signal is present on the second control conductor, wherein the second digital control signal has the opposite digital logic value to the digital logic value of the first digital control signal on the first control conductor, wherein the second control conductor is coupled to the gate terminals of the first and second turn-off N-channel transistors.

4. The apparatus of claim 3, further comprising:
a second resistor having a first lead coupled to the first control conductor and having a second lead coupled to the first terminal of the first turn-off N-channel transistor.

5. The apparatus of claim 4, further comprising:
a third resistor having a first lead coupled to the second control conductor and having a second lead coupled to the second terminal of the main N-channel transistor.

6. The apparatus of claim 1, further comprising:
a transformer winding that supplies the RF signal onto the first terminal of the main N-channel transistor; and
a driver amplifier that receives the RF signal from the second terminal of the main N-channel transistor.

7. The apparatus of claim 1, further comprising:
a driver amplifier that supplies the RF signal onto the first terminal of the main N-channel transistor; and
an integrated circuit terminal coupled to receive the RF signal from the second terminal of the main N-channel transistor.

8. The apparatus of claim 1, further comprising:
a first RF isolation switch circuit having a first terminal, a second terminal, and a control terminal, wherein the second terminal of the first RF isolation switch circuit is coupled to the first terminal of the main N-channel transistor;
a second RF isolation switch circuit having a first terminal, a second terminal, and a control terminal, wherein the second terminal of the second RF isolation switch circuit is coupled to the second terminal of the main N-channel transistor, wherein the control terminal of the second RF isolation switch circuit is coupled to the control terminal of the first RF isolation switch circuit; and
a N-channel transistor having a first terminal, a second terminal, and a control terminal, wherein the first terminal of the N-channel transistor is coupled to a ground conductor, and wherein the second terminal of the N-channel transistor is coupled to the first terminal of the first RF isolation switch circuit and to the first terminal of the second RF isolation switch circuit.

9. A method comprising:
controlling a main transistor of an RF isolation switch circuit to turn off by coupling a gate of the main transistor to a source of the main transistor through a gate-to-source shorting circuit, and by supplying a digital logic low voltage onto the gate of the main transistor, wherein the gate-to-source shorting circuit includes a first turn-off transistor having a second terminal coupled to the gate of the main transistor and having a first terminal coupled to an intermediate node, and wherein the gate-to-source shorting circuit further includes a second turn-off transistor having a second terminal coupled to the intermediate node and a first terminal coupled to the source of the main transistor, wherein the main transistor and the gate-to-source shorting circuit are parts of the RF isolation switch circuit wherein the main transistor is configured for passing an RF signal; and
controlling the main transistor to turn on by turning off the first and second turn-off transistors of the gate-to-source shorting circuit and by supplying a digital logic high voltage onto the gate of the main transistor.

10. The method of claim 9, wherein the digital logic low voltage is supplied onto the gate of the main transistor by supplying the digital logic low voltage onto a first lead of a resistor, wherein a second lead of the resistor is coupled to the gate of the main transistor, and wherein the digital logic high voltage is supplied onto the gate of the main transistor by supplying the digital logic high voltage onto the first lead of the resistor.

11. The method of claim 9, further comprising:
supplying a first digital logic level signal onto a first control input conductor, wherein if the first digital logic level signal is the digital logic high voltage then the main transistor is turned off and the digital logic high voltage is resistively coupled from the first control input conductor onto the gate of the main transistor, whereas if the first digital logic level signal is the digital logic low voltage then the main transistor is turned on and the digital logic low voltage is resistively coupled from the first control input conductor onto the gate of the main transistor.

12. The method of claim 11, further comprising:
resistively coupling the first control input conductor to the intermediate node.

13. The method of claim 11, further comprising:
supplying a second digital logic level signal onto a second control input conductor, wherein the second digital logic level signal has a digital logic value opposite the first digital logic level signal, and wherein the second control input conductor is coupled to a gate of the first turn-off transistor and to a gate of the second turn-off transistor.

14. The method of claim 13, further comprising:
resistively coupling the second control input conductor to a drain of the main transistor.

15. The method of claim 9, further comprising:
receiving the RF signal onto the source of the main transistor from a transformer winding, wherein the RF signal has a frequency of at least 500 MHz.

16. The method of claim 9, further comprising:
receiving the RF signal onto the source of the main transistor from a driver amplifier, wherein the RF signal has a frequency of at least 500 MHz.

17. An apparatus comprising:
a main N-channel transistor having a source terminal, a drain terminal, a bulk terminal, and a gate terminal;
a first switch transistor having a first terminal coupled to the bulk terminal of the main N-channel transistor, a second terminal coupled to the source terminal of the main transistor, and a gate terminal;
a second switch transistor having a first terminal coupled to the bulk terminal of the main N-channel transistor, a second terminal, and a gate terminal;
a ground conductor; and
a resistor having a first lead coupled to the second terminal of the second switch transistor and having a second lead coupled to the ground conductor, the resistor switchably coupled by the second switch transistor to the bulk node the first lead further coupled to the second terminal of the second switch transistor.

18. The apparatus of claim 17, wherein a first digital logic signal is present on the gate terminal of the main N-channel transistor and on the gate terminal of the first switch transistor, and wherein a second digital logic signal of opposite polarity to the first digital logic signal is present on the gate terminal of the second switch transistor.

19. The apparatus of claim 17, further comprising:
an inverter having an input lead and an output lead, wherein the input lead is coupled to the gate terminal of the main N-channel transistor and to the gate terminal of the first switch transistor, and wherein the output lead of the inverter is coupled to the gate terminal of the second switch transistor.

20. The apparatus of claim 17, further comprising:
a driver amplifier that supplies an RF signal onto the source terminal of the main N-channel transistor, wherein the RF signal has a frequency of at least 500 MHz.

21. The apparatus of claim 20, wherein the drain terminal of the main N-channel transistor is coupled to supply the RF signal onto an integrated circuit terminal.

22. A method comprising:
(a) controlling a main transistor of an RF isolation switch circuit to turn off by supplying a digital logic low voltage onto a gate terminal of the main transistor, by decoupling a bulk terminal of the main transistor from a source terminal of the main transistor, and by coupling the bulk terminal of the main transistor to a ground conductor through a resistor; and (b) controlling the main transistor to turn on by supplying a digital logic high voltage onto the gate terminal, by coupling the bulk terminal to the source terminal, and by decoupling the bulk terminal from the ground conductor.

23. The method of claim 22, further comprising:
receiving an RF signal of at least 500 MHz onto the source terminal of the main transistor.

24. The method of claim 22, wherein a first switch transistor of the RF isolation switch circuit has a first terminal coupled to the bulk terminal of the main transistor, and has a second terminal coupled to the source terminal of the main transistor, wherein the bulk terminal of the main transistor is decoupled from the source terminal of the main transistor in (a) by turning off the first switch transistor, and wherein the bulk terminal of the main transistor is coupled to the source terminal of the main transistor in (b) by turning on the first switch transistor.

25. The method of claim 24, wherein a second switch transistor of the RF isolation switch circuit has a first terminal coupled to the bulk terminal of the main transistor, and has a second terminal that is resistively coupled through the resistor to the ground conductor, wherein the bulk terminal is coupled to the ground conductor through the resistor in (a) by turning on the second switch transistor, and wherein the bulk terminal is decoupled from the ground conductor in (b) by turning off the second switch transistor.

26. An apparatus comprising:
a main N-channel transistor having a source terminal, a drain terminal, a bulk terminal, and a gate terminal;
a first turn-off N-channel transistor having a first terminal, a second terminal, and a gate terminal, wherein the second terminal of the first turn-off N-channel transistor is coupled to the gate terminal of the main N-channel transistor;
a second turn-off N-channel transistor having a first terminal, a second terminal, and a gate terminal, wherein the second terminal of the second turn-off N-channel transistor is coupled to the first terminal of the first turn-off N-channel transistor, and wherein the first terminal of the second turn-off N-channel transistor is coupled to the source terminal of the main N-channel transistor;
a first switch transistor having a first terminal coupled to the bulk terminal of the main N-channel transistor, a second terminal coupled to the source terminal of the main transistor, and a gate terminal;
a second switch transistor having a first terminal coupled to the bulk terminal of the main N-channel transistor, a second terminal, and a gate terminal;
a ground conductor;
a resistor having a first lead coupled to the second terminal of the second switch transistor and having a second lead coupled to the ground conductor; and
a first control conductor, wherein the main transistor is turned off when a first digital control signal on the first control conductor has a first digital logic value, and wherein the main transistor is turned on when the first digital control signal on the first control conductor has a second digital logic value opposite the first digital logic value.

27. The apparatus of claim 26, wherein the first control conductor is coupled to the gate terminal of the main N-channel transistor via a resistor.

28. The apparatus of claim 26, further comprising:
a second control conductor, wherein a second digital control signal opposite the first digital control signal is present on the second control conductor, wherein the second control conductor is coupled to the gate terminal of the first turn-off N-channel transistor, to the gate terminal of the second turn-off N-channel transistor, and to the gate terminal of the second switch transistor.

29. The apparatus of claim 28, wherein the gate of the first switch transistor is coupled to the first control conductor.

30. A method comprising:
(a) controlling a main transistor of an RF isolation switch circuit to turn off by supplying a digital logic low voltage onto a gate terminal of the main transistor, by decoupling a bulk terminal of the main transistor from a source terminal of the main transistor, by coupling the gate terminal of the main transistor to the source terminal of the main transistor, and by coupling the bulk terminal of the main transistor to a ground conductor through a resistor; and
(b) controlling the main transistor to turn on by supplying a digital logic high voltage onto the gate terminal, by coupling the bulk terminal to the source terminal, by decoupling the gate of the main transistor from the source of the main transistor, and by decoupling the bulk terminal from the ground conductor.

31. The method of claim 30, wherein the gate of the main transistor is coupled to the source of the main transistor in (a) by controlling two transistors of a gate-to-source shorting circuit to be on, wherein a first of the two transistors has a second terminal coupled to the gate terminal of the main transistor, wherein a second of the two transistors has a second terminal coupled to a first terminal of the first of the two transistors, wherein the second of the two transistors has a first terminal coupled to the source terminal of the main transistor, and wherein the gate of the main transistor is decoupled from the source of the main transistor in (b) by controlling the two transistors of the gate-to-source shorting circuit to be off.

32. An apparatus comprising:
an input signal conductor;
means for switching having a first electrode, a second electrode, and a control electrode, wherein an RF input signal having a frequency of at least 500 MHz is present on the first electrode; and
means for shorting the first electrode to the control electrode when a control signal on the input signal conductor has a first digital logic level and for controlling the means for switching such that the means for switching is off when the control signal has the first digital logic level, wherein the means for shorting is also for decoupling the first electrode from the control electrode when the control signal has a second digital logic level opposite the first digital logic level and for controlling the means for switching to be on off when the control signal has the second digital logic level.

33. The apparatus of claim 32, wherein the means for shorting is also for coupling a bulk electrode of the means for switching to ground through a resistance when the control signal has the first digital logic level, and wherein the means for shorting is also for coupling the bulk electrode to the first electrode when the control signal has the second digital logic level.

34. The apparatus of claim 32, wherein the means for switching is a transistor, wherein the first electrode is a source terminal, wherein the second electrode is a drain terminal, and wherein the control electrode is a gate terminal.

35. A method of manufacture comprising the steps of:
fabricating a main N-channel transistor having a first terminal, a second terminal, and a gate terminal and configured for passing an RF signal;

fabricating a first turn-off N-channel transistor having a first terminal, a second terminal, and a gate terminal, wherein the second terminal of the first turn-off N-channel transistor is coupled to the gate terminal of the main N-channel transistor;

fabricating a second turn-off N-channel transistor having a first terminal, a second terminal, and a gate terminal, wherein the second terminal of the second turn-off N-channel transistor is coupled to the first terminal of the first turn-off N-channel transistor, and wherein the first terminal of the second turn-off N-channel transistor is coupled to the first terminal of the main N-channel transistor; and fabricating a control conductor that is coupled to the main transistor such that the main transistor is turned off when a digital control signal on the control conductor has a first digital logic value and such that the main transistor is turned on when the first digital control signal on the first control conductor has a second digital logic value opposite the first digital logic value, wherein the main N-channel transistor, the first turn-off N-channel transistor, the second turn-off N-channel transistor, and the first control conductor are parts of an RF switch.

36. The method of manufacture of claim 35, further comprising:

fabricating a balun having a primary winding and a plurality of secondary windings such that one of the secondary windings is coupled to the RF switch.

37. The method of manufacture of claim 36, further comprising:

fabricating a driver amplifier such that an input lead of the driver amplifier is coupled to the RF switch.

* * * * *